(12) United States Patent
Kim et al.

(10) Patent No.: US 12,086,352 B2
(45) Date of Patent: Sep. 10, 2024

(54) TRANSPARENT TOUCH DISPLAY DEVICE

(71) Applicant: LG Display Co., Ltd., Seoul (KR)

(72) Inventors: Juhong Kim, Paju-si (KR); Hwideuk Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/979,707

(22) Filed: Nov. 2, 2022

(65) Prior Publication Data

US 2023/0214036 A1     Jul. 6, 2023

(30) Foreign Application Priority Data

Dec. 31, 2021   (KR) .......................... 10-2021-0193833

(51) Int. Cl.
*G06F 3/041*     (2006.01)
*G06F 3/044*     (2006.01)
*H10K 59/40*    (2023.01)

(52) U.S. Cl.
CPC ........ G06F 3/04164 (2019.05); G06F 3/0412 (2013.01); G06F 3/0443 (2019.05); H10K 59/40 (2023.02); *G06F 3/044* (2013.01); *G06F 3/0446* (2019.05); *G06F 2203/04111* (2013.01)

(58) Field of Classification Search
CPC .... G02F 1/13338; G06F 3/041; G06F 3/0412; G06F 3/04164; G06F 3/04166; G06F 3/044; G06F 3/0443; G06F 3/0449; G06F 2203/04103; G06F 2203/04111; G06F 2203/04112; G06F 3/0446; H10K 59/40

See application file for complete search history.

(56) References Cited

U.S. PATENT DOCUMENTS

| | | | | |
|---|---|---|---|---|
| 2021/0200407 A1* | 7/2021 | Jang | .................... | G06F 3/04164 |
| 2022/0171484 A1* | 6/2022 | Lee | ........................ | H10K 59/12 |
| 2022/0206610 A1* | 6/2022 | Kim | ........................ | G06F 3/0446 |
| 2022/0206651 A1* | 6/2022 | Park | ....................... | G06F 3/0412 |

FOREIGN PATENT DOCUMENTS

EP         4124937 A1 *  2/2023  ........... G06F 3/0412

* cited by examiner

*Primary Examiner* — Julie Anne Watko
(74) *Attorney, Agent, or Firm* — Seed IP Law Group LLP

(57) ABSTRACT

A transparent touch display device according to embodiments of the disclosure may comprise a substrate including a pixel area, a first transmissive area positioned on a first side of the pixel area, and a second transmissive area positioned on a second side of the pixel area, a driving transistor disposed in the pixel area, an anode electrode disposed in the pixel area, positioned on the driving transistor, and electrically connected with a source electrode or drain electrode of the driving transistor, a light emitting layer positioned on the anode electrode, a display cathode electrode positioned on the light emitting layer, a first touch cathode electrode disposed in the first transmissive area and positioned on a first side of the display cathode electrode, a second touch cathode electrode disposed in the second transmissive area and positioned on a second side of the display cathode electrode, an encapsulation layer disposed on the display cathode electrode, the first touch cathode electrode, and the second touch cathode electrode, and a first touch line overlapping the first touch cathode electrode.

20 Claims, 17 Drawing Sheets

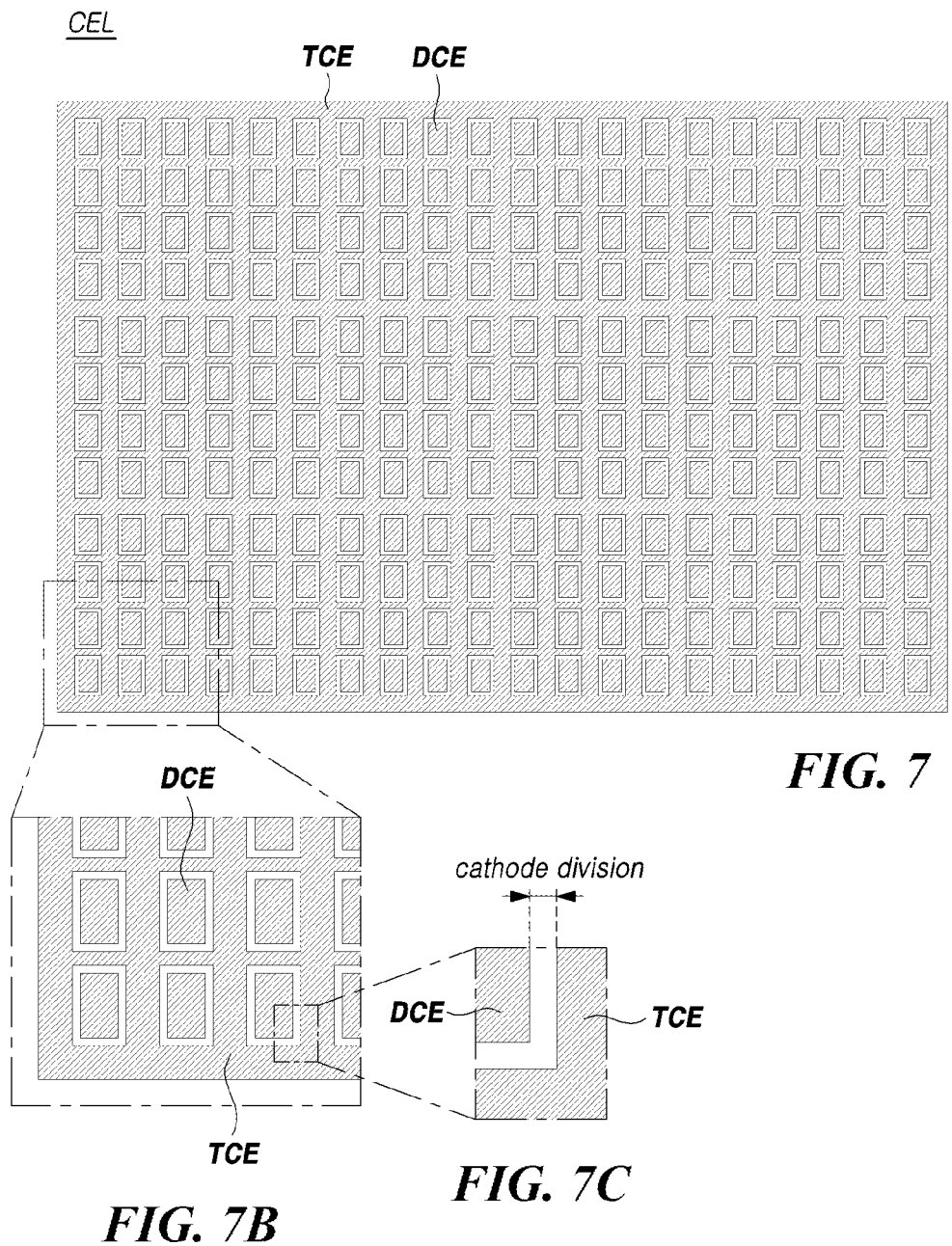

TRANSPARENT TOUCH DISPLAY DEVICE

CROSS-REFERENCE TO RELATED APPLICATION

This application claims priority from Korean Patent Application No. 10-2021-0193833, filed on Dec. 31, 2021, which is hereby incorporated by reference for all purposes as if fully set forth herein.

BACKGROUND

Technical Field

Embodiments of the disclosure relate to transparent touch display devices.

Description of Related Art

Among others, touch display devices provide an input scheme that allows users easier and more intuitive and convenient entry of information or commands without the need for buttons, a keyboard, a mouse, or other typical input means.

To provide a touch-based input function, such a touch display device includes a touch sensor structure and a touch circuit for touch sensing. A touch sensor structure of a touch display device may include a plurality of touch electrodes and a plurality of touch lines for connecting the plurality of touch electrodes to the touch circuit. The touch sensing circuit needs to be operated according to the touch sensor structure.

Nowadays, to reduce the thickness of the touch display device and enhance image quality, touch display devices having a built-in touch sensor including a plurality of touch electrodes are being developed. There is also increasing demand for transparent touch display devices including a display panel having self-emissive light emitting elements, such as those of an organic light emitting diode (OLED) display, and through which light may be transmitted.

BRIEF SUMMARY

In the conventional touch and display technology field, there have been developed touch display devices having a touch sensor built in the display panel to reduce the thickness and enhance image quality. However, If the touch-screen-embedded touch display device is a self-emissive display device having self-emissive light emitting elements, such as an organic light emitting diode (OLED) display, and a transparent display device through which light is transmitted, it is significantly hard to design and manufacture touch sensor-embedded display panels by the nature of the display panel required to provide self-emission and light transmittance. The inventors of the disclosure have invented a transparent touch display device including a display panel having a built-in touch sensor capable of precise touch sensing and having superior self-emissive performance and high transmittance.

According to embodiments of the disclosure, there may be provided a transparent touch display device including a display panel having a built-in touch sensor capable of precise touch sensing and having superior self-emissive performance and high transmittance.

According to embodiments of the disclosure, there may be provided a transparent touch display device having a touch sensor on a cathode electrode layer by cathode division.

According to embodiments of the disclosure, there may be provided a transparent touch display device having a touch sensor built in a display panel not to influence the transmittance of the display panel.

According to embodiments of the disclosure, there may be provided a transparent touch display device capable of slimming down the display panel and reducing the complexity of the panel manufacturing process.

According to embodiments of the disclosure, there may be provided a transparent touch display device capable of reducing the influence of the driving of the light emitting elements on touch sensing as much as possible when placing the light emitting element and touch sensor in the display panel.

According to embodiments of the disclosure, there may be provided a transparent touch display device capable of mitigating or preventing parasitic capacitance in the touch lines arranged in the display panel.

A transparent touch display device according to embodiments of the disclosure may include a display cathode electrode and a touch cathode electrode into which a cathode electrode layer is divided and may include a touch line overlapping the touch cathode electrode.

A transparent touch display device according to embodiments of the disclosure may include a touch line disposed in a metal layer positioned farthest from an anode electrode of a light emitting element.

A transparent touch display device according to embodiments of the disclosure may comprise a substrate including a pixel area, a first transmissive area positioned on a first side of the pixel area, and a second transmissive area positioned on a second side of the pixel area, a driving transistor disposed in the pixel area, an anode electrode disposed in the pixel area, positioned on the driving transistor, and electrically connected with a source electrode or drain electrode of the driving transistor, a light emitting layer positioned on the anode electrode, a display cathode electrode positioned on the light emitting layer, a first touch cathode electrode disposed in the first transmissive area and positioned on a first side of the display cathode electrode, a second touch cathode electrode disposed in the second transmissive area and positioned on a second side of the display cathode electrode, an encapsulation layer disposed on the display cathode electrode, the first touch cathode electrode, and the second touch cathode electrode, and a first touch line overlapping the first touch cathode electrode.

In the transparent touch display device according to embodiments of the disclosure, the display cathode electrode may include the same material as the first touch cathode electrode and the second touch cathode electrode and may be electrically separated from the first touch cathode electrode and the second touch cathode electrode.

In the transparent touch display device according to embodiments of the disclosure, the first touch line may be electrically connected with the first touch cathode electrode or the second touch cathode electrode.

The transparent touch display device according to embodiments of the disclosure may further comprise a first touch bridge electrically connecting the first touch cathode electrode and the second touch cathode electrode across the pixel area.

In the transparent touch display device according to embodiments of the disclosure, the first touch line may be disposed in the metal layer closest to the substrate.

In the transparent touch display device according to embodiments of the disclosure, the first touch bridge may cross the first touch line.

In the transparent touch display device according to embodiments of the disclosure, the first touch line may be electrically connected with the first touch bridge.

A transparent touch display device according to embodiments of the disclosure may comprise a substrate including a pixel area, a first transmissive area positioned on a first side of the pixel area, and a second transmissive area positioned on a second side of the pixel area, a display cathode electrode to which a base voltage for display driving is applied, a first touch cathode electrode positioned on a first side of the display cathode electrode and including a same material as the display cathode electrode, a second touch cathode electrode positioned on a second side of the display cathode electrode and including a same material as the display cathode electrode, a first touch bridge electrically connecting the first touch cathode electrode and the second touch cathode electrode across the pixel area, and a first touch line crossing the first touch bridge and overlapping the first touch cathode electrode.

According to embodiments of the disclosure, there may be provided a transparent touch display device including a display panel having a built-in touch sensor capable of precise touch sensing and having superior self-emissive performance and high transmittance.

According to embodiments of the disclosure, there may be provided a transparent touch display device having a touch sensor on a cathode electrode layer by cathode division.

According to embodiments of the disclosure, there may be provided a transparent touch display device having a touch sensor built in a display panel not to influence the transmittance of the display panel.

According to embodiments of the disclosure, there may be provided a transparent touch display device capable of slimming down the display panel and reducing the complexity of the panel manufacturing process.

According to embodiments of the disclosure, there may be provided a transparent touch display device capable of reducing the influence of the driving of the light emitting elements on touch sensing as much as possible by placing the touch line in the metal layer farthest from the anode electrode of the light emitting element when placing the light emitting element and touch sensor in the display panel.

According to embodiments of the disclosure, there may be provided a transparent touch display device capable of mitigating or preventing parasitic capacitance in the touch lines arranged in the display panel.

DESCRIPTION OF THE SEVERAL VIEWS OF THE DRAWINGS

The technical benefits, features, and advantages of the present disclosure will be more clearly understood from the following detailed description, taken in conjunction with the accompanying drawings, in which:

FIGS. 7 and 8 are views illustrating another cathode division structure of a display panel of a transparent touch display device according to embodiments of the disclosure;

DETAILED DESCRIPTION

Figure 1:
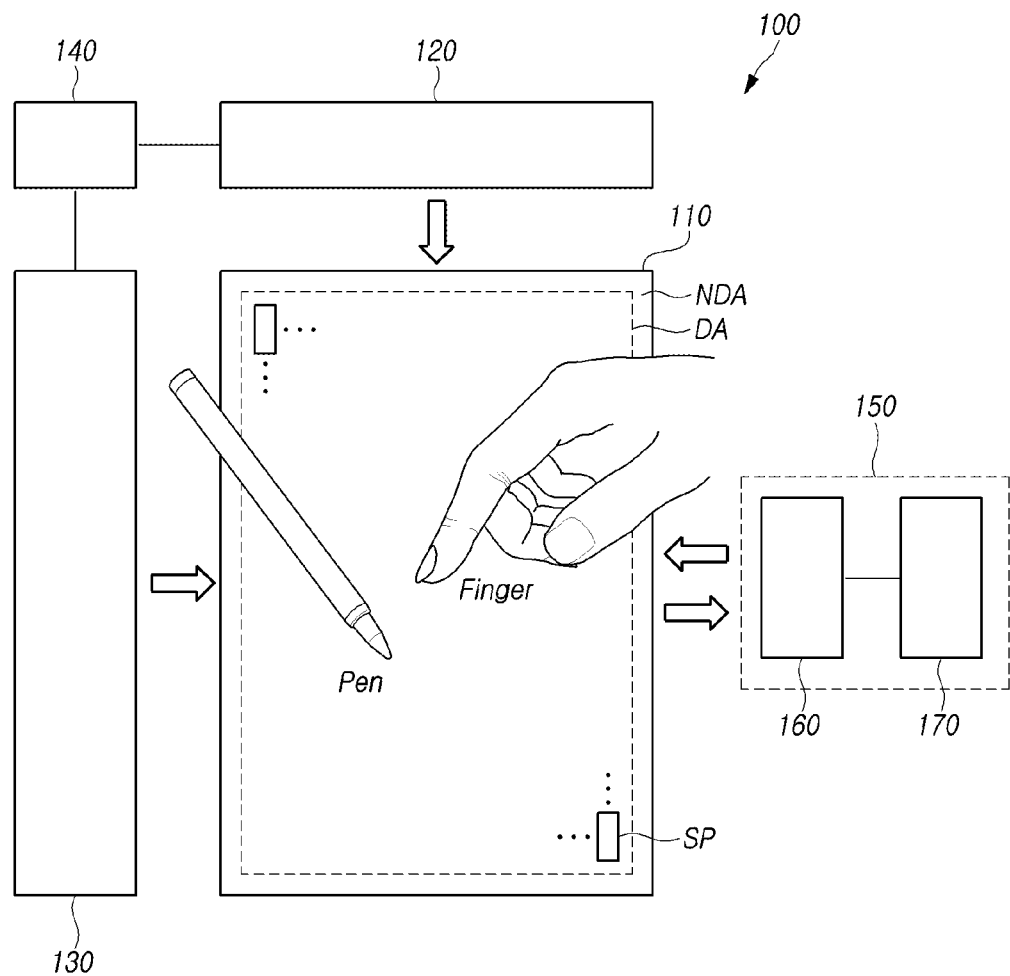
FIG. 1 is a view illustrating a system configuration of a transparent touch display device according to embodiments of the disclosure.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including," "having," "containing," and "constituting" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to," "overlaps" etc., a second element, it should be interpreted that, not only can the first element "be directly connected or coupled to" or "directly contact or overlap" the second element, but a third element can also be "interposed" between the first and second elements, or the first and second elements can "be connected or coupled to," "overlap," etc., each other via a fourth element. Here, the second element may be included in at least one of two or more elements that "are connected or coupled to," "contact or overlap," etc., each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc., are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, various embodiments of the present disclosure are described in detail with reference to the accompanying drawings.

FIG. 1 is a view illustrating a system configuration of a transparent touch display device 100 according to embodiments of the disclosure.

Referring to FIG. 1, a transparent touch display device 100 may include a display panel 110 and display driving circuits, as components for displaying images.

The display driving circuits are circuits for driving the display panel 110 and may include a data driving circuit 120, a gate driving circuit 130, and a display controller 140.

The display panel 110 may include a display area DA in which images are displayed and a non-display area NDA in which no image is displayed. The non-display area NDA may be an outer area of the display area DA and be referred to as a bezel area.

The display panel 110 may include a plurality of subpixels SP. The display panel 110 may further include various types of signal lines to drive the plurality of subpixels SP.

Various types of signal lines may include a plurality of data lines transferring data signals (also referred to as data voltages or image signals) and a plurality of gate lines transferring gate signals (also referred to as scan signals). The plurality of data lines and the plurality of gate lines may cross each other. Each of the plurality of data lines may be disposed while extending in a first direction. Each of the plurality of gate lines may be disposed while extending in a second direction. Here, the first direction may be a column direction and the second direction may be a row direction. Alternatively or additionally, the first direction may be the row direction, and the second direction may be the column direction.

The transparent touch display device 100 according to embodiments of the disclosure may be a liquid crystal display device or a self-emission display device in which the display panel 110 emits light by itself. When the transparent touch display device 100 according to the embodiments of the disclosure is a self-emission display device, each of the plurality of subpixels SP may include a light emitting element.

For example, the transparent touch display device 100 according to embodiments of the disclosure may be an organic light emitting display device in which the light emitting element is implemented as an organic light emitting diode (OLED). As another example, the transparent touch display device 100 according to embodiments of the disclosure may be an inorganic light emitting display device in which the light emitting element is implemented as an inorganic material-based light emitting diode. As another example, the transparent touch display device 100 according to embodiments of the disclosure may be a quantum dot display device in which the light emitting element is implemented as a quantum dot which is self-emission semiconductor crystal.

The structure of each of the plurality of subpixels SP may vary according to the type of the transparent touch display device 100. For example, when the transparent touch display device 100 is a self-emission display device in which the subpixels SP emit light by themselves, each subpixel SP may include a light emitting element that emits light by itself, one or more transistors, and one or more capacitors.

The data driving circuit 120 is a circuit for driving the plurality of data lines and may supply data signals to the plurality of data lines. The gate driving circuit 130 is a circuit for driving the plurality of gate lines and may supply gate signals to the plurality of gate lines. The display controller 140 is a device for controlling the data driving circuit 120 and the gate driving circuit 130 and may control driving timings for the plurality of data lines and driving timings for the plurality of gate lines.

The display controller 140 may supply a data driving control signal to the data driving circuit 120 to control the data driving circuit 120 and may supply a gate driving control signal to the gate driving circuit 130 to control the gate driving circuit 130.

The data driving circuit 120 may supply data signals to the plurality of data lines according to the driving timing control of the display controller 140. The data driving circuit 120 may receive digital image data from the display controller 140 and may convert the received image data into analog data signals and output the analog data signals to the plurality of data lines.

The gate driving circuit 130 may supply gate signals to the plurality of gate lines according to the driving timing control of the display controller 140. The gate driving circuit 130 may receive a first gate voltage corresponding to a turn-on level voltage and a second gate voltage corresponding to a turn-off level voltage, along with various gate driving control signals (e.g., start signal and reset signal), generate gate signals, and supply the generated gate signals to the plurality of gate lines.

For example, the data driving circuit 120 may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may be connected with the display panel 110 by TAB method or connected to a bonding pad of the display panel 110 by a COG or COP method or may be connected with the display panel 110 according to a COF method. Alternatively or additionally, the gate driving circuit 130 may be formed in a gate in panel (GIP) type, in the non-display area NDA of the display panel 110. The gate driving circuit 130 may be disposed on the substrate or may be connected to the substrate. In other words, the gate driving circuit 130 that is of a GIP type may be disposed in the non-display area NDA of the substrate. The gate driving circuit 130 that is of a chip-on-glass (COG) type or chip-on-film (COF) type may be connected to the substrate.

Meanwhile, at least one of the data driving circuit 120 and the gate driving circuit 130 may be disposed in the display area DA of the display panel 110. For example, at least one of the data driving circuit 120 and the gate driving circuit 130 may be disposed not to overlap the subpixels SP or to overlap all or some of the subpixels SP.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The display controller 140 may be implemented as a separate component from the data driving circuit 120, or the display controller 140 and the data driving circuit 120 may be integrated into an integrated circuit (IC).

The display controller 140 may be a timing controller used in typical display technology, a control device that may perform other control functions as well as the functions of the timing controller, or a control device other than the timing controller, or may be a circuit in the control device. The display controller 140 may be implemented as various circuits or electronic components, such as an integrated circuit (IC), a field programmable gate array (FPGA), an application specific integrated circuit (ASIC), or a processor.

The display controller 140 may be mounted on a printed circuit board or a flexible printed circuit and may be electrically connected with the data driving circuit 120 and the gate driving circuit 130 through the printed circuit board or the flexible printed circuit.

The display controller 140 may transmit/receive signals to/from the data driving circuit 120 according to one or more predetermined interfaces. The interface may include, e.g., a low voltage differential signaling (LVDS) interface, an EPI interface, and a serial peripheral interface (SP).

To provide a touch sensing function as well as an image display function, the transparent touch display device 100 according to embodiments of the disclosure may include a touch sensor and a touch sensing circuit 150 that senses the touch sensor to detect whether a touch occurs by a touch object, such as a finger or pen, or the position of the touch.

The touch sensing circuit 150 may include a touch driving circuit 160 that drives and senses the touch sensor and generates and outputs touch sensing data and a touch controller 170 that may detect an occurrence of a touch or the position of the touch using touch sensing data.

The touch sensor may include a plurality of touch electrodes. The touch sensor may further include a plurality of touch lines for electrically connecting the plurality of touch electrodes and the touch driving circuit 160. The touch sensor is also referred to as a touch panel.

In the case of the transparent touch display device 100 according to embodiments of the disclosure, a touch sensor may be present inside the display panel 110. In this case, the touch sensor is referred to as a built-in touch sensor or an in-cell touch sensor. During the manufacturing process of the display panel 110, the built-in touch sensor may be formed together with electrodes or signal lines related to driving the display.

The touch driving circuit 160 may supply a touch driving signal to at least one of the plurality of touch electrodes included in the touch sensor and may sense at least one of the plurality of touch electrodes to generate touch sensing data.

The touch sensing circuit 150 may perform touch sensing in a self-capacitance sensing scheme or a mutual-capacitance sensing scheme.

When the touch sensing circuit 150 performs touch sensing in the self-capacitance sensing scheme, the touch sensing circuit 150 may perform touch sensing based on capacitance between each touch electrode and the touch object (e.g., finger or pen). According to the self-capacitance sensing scheme, each of the plurality of touch electrodes may serve both as a driving touch electrode and as a sensing touch electrode. The touch driving circuit 160 may drive all or some of the plurality of touch electrodes and sense all or some of the plurality of touch electrodes.

When the touch sensing circuit 150 performs touch sensing in the mutual-capacitance sensing scheme, the touch sensing circuit 150 may perform touch sensing based on capacitance between the touch electrodes. According to the mutual-capacitance sensing scheme, the plurality of touch electrodes are divided into driving touch electrodes and sensing touch electrodes. The touch driving circuit 160 may drive the driving touch electrodes and sense the sensing touch electrodes.

As described herein, the touch sensing circuit 150 may perform touch sensing in a self-capacitance sensing scheme and/or a mutual-capacitance sensing scheme. However, for convenience of description, it is assumed, as an example, that the touch sensing circuit 150 performs touch sensing using a self-capacitance sensing scheme.

Each of the touch driving circuit 160 and the touch controller 170 may be implemented as a separate integrated circuit. Alternatively or additionally, the touch driving circuit 160 and the touch controller 170 may be integrated with each other.

Each of the touch driving circuit 160 and the data driving circuit 120 may be implemented as a separate integrated circuit. The touch driving circuit 160 and the data driving circuit 120 may be integrated with each other. For example, when the transparent touch display device 100 includes one driving integrated circuit chip, the one driving integrated circuit chip may include the touch driving circuit 160 and the data driving circuit 120. As another example, when the transparent touch display device 100 includes a plurality of driving integrated circuit chips, each of the plurality of driving integrated circuit chips may include part of the touch driving circuit 160 and part of the data driving circuit 120.

The transparent touch display device 100 may further include a power supply circuit for supplying various types of power to the display driver integrated circuit and/or the touch sensing circuit.

The transparent touch display device 100 according to embodiments of the disclosure may be a mobile terminal, such as a smart phone or a tablet, or a monitor or television (TV) in various sizes but, without limited thereto, may be a display in various types and various sizes capable of displaying information or images.

Figure 2:
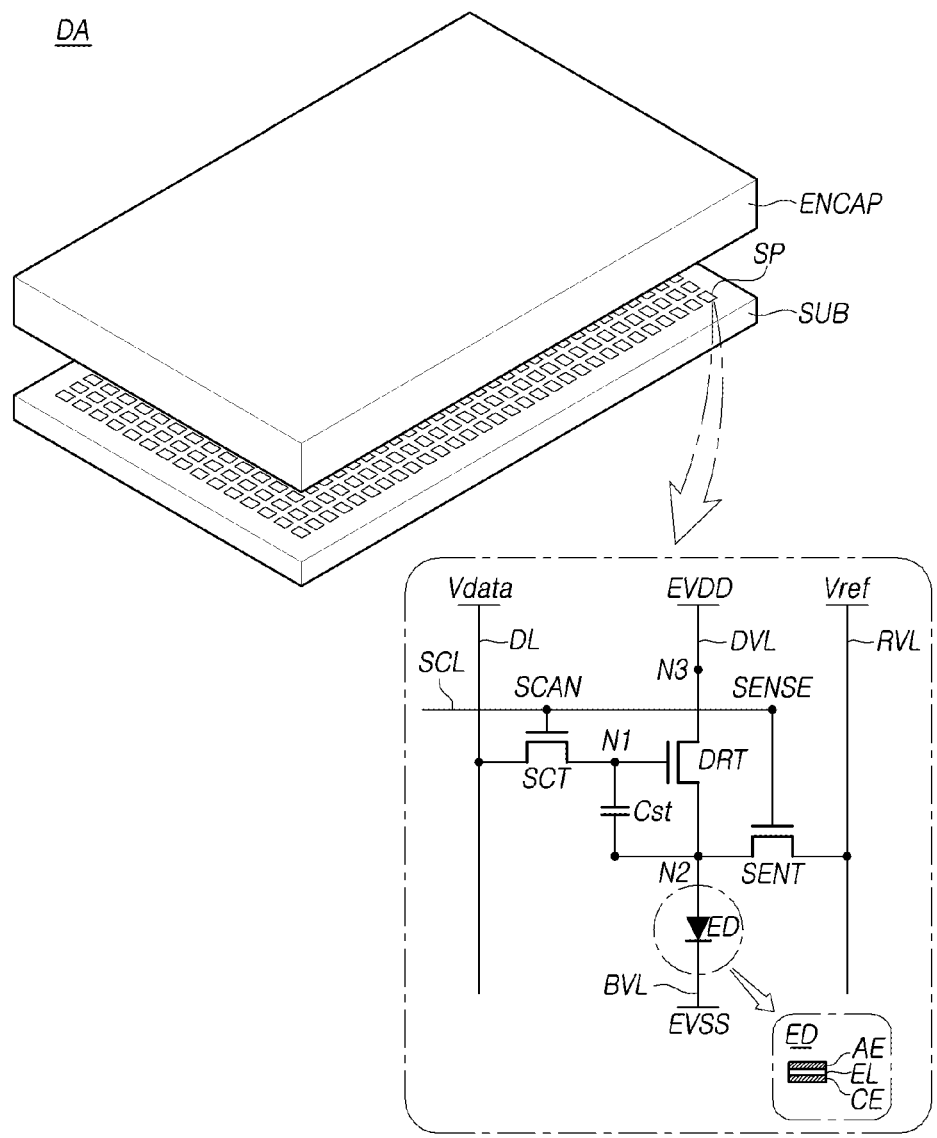
FIG. 2 is a view schematically illustrating a structure of a display panel of a transparent touch display device according to embodiments of the disclosure.

FIG. 2 is a view schematically illustrating a structure of a display panel 110 of a transparent touch display device 100 according to embodiments of the disclosure.

Each of a plurality of subpixels SP arranged in the display area DA of the display panel 110 of the transparent touch display device 100 may include a light emitting element ED, a driving transistor DRT for driving the light emitting element ED, a scan transistor SCT for transferring a data voltage Vdata to a first node N1 of the driving transistor DRT, and a storage capacitor Cst for maintaining a constant voltage during one frame.

The driving transistor DRT may include the first node N1 to which the data voltage may be applied, a second node N2 electrically connected with the light emitting element ED, and a third node N3 to which a driving voltage EVDD is applied from a driving voltage line DVL. In the driving transistor DRT, the first node N1 may be a gate node, the second node N2 may be a source node or a drain node, and the third node N3 may be the drain node or the source node. Hereinafter, for convenience of description, the first node N1 of the driving transistor DRT may also be referred to as a gate node or a gate electrode, the second node N2 of the driving transistor DRT may also be referred to as a source node or a source electrode, and the third node N3 of the driving transistor DRT may also be referred to as a drain node or a drain electrode.

The light emitting element ED may include an anode electrode AE, a light emitting layer EL, and a cathode electrode CE. The anode electrode AE of the light emitting element ED may be electrically connected to the second node N2 of the driving transistor DRT of each subpixel SP. The cathode electrode CE of the light emitting element ED may be electrically connected to a base voltage line BVL to which a base voltage EVSS is applied.

The anode electrode AE may be a pixel electrode disposed in each subpixel SP. The cathode electrode CE may be a common electrode to which the base voltage EVSS, which is a type of common voltage commonly required for driving the subpixels SP, is applied.

For example, the light emitting element ED may be an organic light emitting diode (OLED), an inorganic light emitting diode, or a quantum dot light emitting element. When the light emitting element ED is an organic light emitting diode (OLED), the light emitting layer EL of the light emitting element ED may include an organic light emitting layer including an organic material.

The scan transistor SCT may be on/off controlled by a scan signal SCAN, which is a gate signal, applied via the scan signal line SCL and be electrically connected between the first node N1 of the driving transistor DRT and the data line DL.

The storage capacitor Cst may be electrically connected between the first node N1 and second node N2 of the driving transistor DRT.

Referring to FIG. 2, each of the plurality of subpixels SP disposed in the display area DA of the display panel 110 of the transparent touch display device 100 may basically include a light emitting element ED, two transistors DRT and SCT, and one capacitor Cst.

Each of the plurality of subpixels SP disposed in the display area DA of the display panel 110 of the transparent touch display device 100 may further include one or more transistors or one or more capacitors.

For example, as illustrated in FIG. 2, each subpixel SP may further include a sensing transistor SENT for controlling the connection between the second node N2 of the driving transistor DRT and the reference voltage line RVL. The reference voltage line RVL is a signal line for supplying a reference voltage Vref to the subpixel SP.

As illustrated in FIG. 2, the gate node of the sensing transistor SENT may be electrically connected to the gate node of the scan transistor SCT. In other words, the scan signal line SCL electrically connected to the gate node of the scan transistor SCT may also be electrically connected to the gate node of the sensing transistor SENT.

Alternatively or additionally, the gate node of the sensing transistor SENT may be electrically connected to a sensing signal line other than the scan signal line SCL connected to the gate node of the scan transistor SCT.

The storage capacitor Cst may be an external capacitor intentionally designed to be outside the driving transistor DRT, but not a parasite capacitor (e.g., Cgs or Cgd) which is an internal capacitor that may be present between the first node N1 and the second node N2 of the driving transistor DRT.

Each of the driving transistor DRT, the scan transistor SCT, and the sensing transistor SENT may be an n-type transistor or a p-type transistor.

Since the circuit elements (particularly, the light emitting elements ED) in each subpixel SP are vulnerable to external moisture or oxygen, the display panel 110 may include an encapsulation layer ENCAP to prevent penetration of external moisture or oxygen into the circuit elements (particularly, the light emitting elements ED).

The encapsulation layer ENCAP may be configured in various types.

For example, the encapsulation layer ENCAP may be disposed to cover the light emitting elements ED. The encapsulation layer ENCAP may include one or more inorganic layers and one or more organic layers.

As another example, the encapsulation layer ENCAP may include an encapsulation substrate, a dam positioned between the thin film transistor array substrate and the encapsulation substrate along the outer edge of the display area DA, and a filler filling the inner space of the dam.

Figure 3:
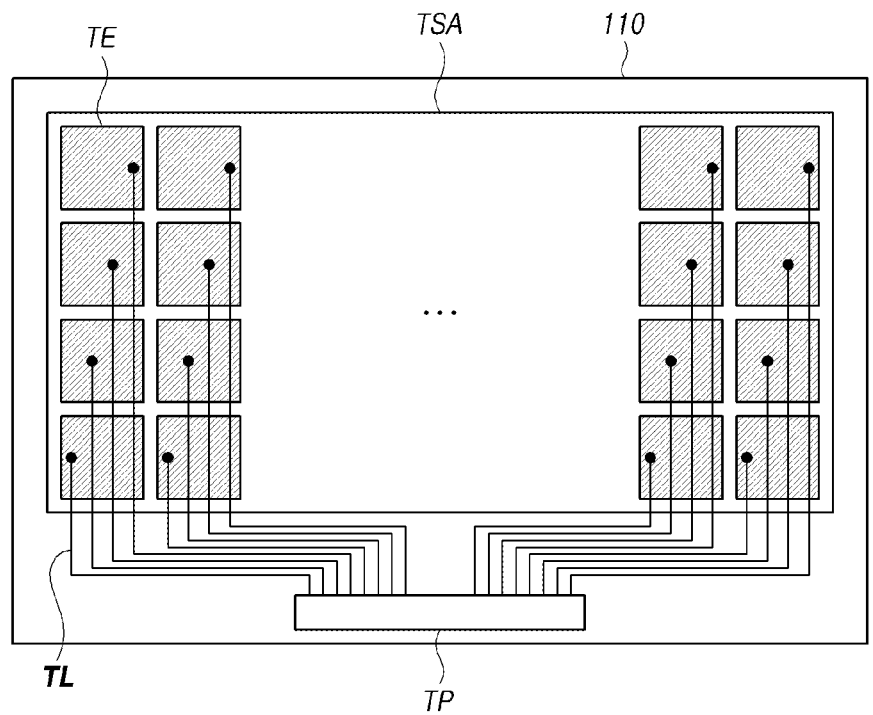
FIG. 3 is a view schematically illustrating a touch sensor structure of a transparent touch display device according to embodiments of the disclosure.

FIG. 3 is a view schematically illustrating a touch sensor structure of a transparent touch display device 100 according to embodiments of the disclosure.

Referring to FIG. 3, the transparent touch display device 100 according to embodiments of the disclosure may include a touch sensor disposed in the touch sensing area TSA of the display panel 110.

The touch sensor included in the transparent touch display device 100 according to embodiments of the disclosure may include a plurality of touch electrodes TE disposed in the touch sensing area TSA.

The touch sensor included in the transparent touch display device 100 according to embodiments of the disclosure may further include a plurality of touch lines TL for electrically connecting the plurality of touch electrodes TE to the plurality of touch pads TP electrically connected to the touch driving circuit 160. The plurality of touch lines TL are also referred to as a plurality of touch routing lines.

When the touch sensor included in the transparent touch display device 100 according to embodiments of the disclosure is of a self-capacitance sensing type, the plurality of touch electrodes TE do not electrically overlap nor cross each other. In the self-capacitance type touch sensor structure, each of the plurality of touch electrodes TE may be one touch node corresponding to touch coordinates.

When the transparent touch display device 100 according to embodiments of the disclosure senses a touch based on self-capacitance, the touch driving circuit 160 may supply a touch driving signal to at least one of the plurality of touch electrodes TE and may sense the touch electrode TE to which the touch driving signal is supplied.

Each of the plurality of touch electrodes TE may be an electrode without an opening or a mesh-type electrode having a plurality of openings. Each of the plurality of touch electrodes TE may be a transparent electrode.

The sensing value for the touch electrode TE to which the touch driving signal is supplied may be a value corresponding to capacitance or a change in capacitance in the touch electrode TE to which the touch driving signal is supplied. The capacitance in the touch electrode TE to which the touch driving signal is supplied may be a capacitance between the touch electrode TE to which the touch driving signal is supplied and a touch pointer, such as a finger.

As described herein, in the transparent touch display device 100 according to embodiments of the disclosure, a touch sensor including a plurality of touch electrodes TE may be embedded in the display panel 110. Accordingly, during the manufacturing process of the display panel 110, when electrodes, lines, and patterns related to display driving are formed, the touch electrodes TE and the touch lines TL may also be formed.

Figure 4:
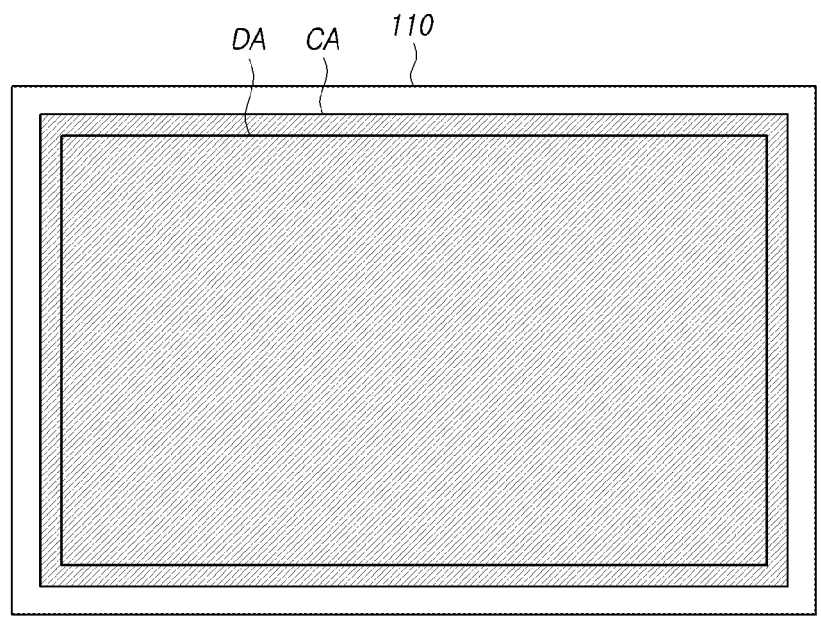
FIG. 4 is a plan view illustrating a display panel of a transparent touch display device according to embodiments of the disclosure.

FIG. 4 is a plan view illustrating a display panel 110 of a transparent touch display device 100 according to embodiments of the disclosure.

Referring to FIG. 4, the display panel 110 of the transparent touch display device 100 according to embodiments of the disclosure may include a cathode electrode area CA that overlaps the display area DA and has a cathode electrode CE disposed therein.

The cathode electrode area CA may have the same area (size) as the display area DA. In this case, the cathode electrode area CA may completely overlap the display area DA. Alternatively or additionally, as illustrated in FIG. 4, the cathode electrode area CA may have a larger area (size) than the display area DA. In this case, the cathode electrode area CA may include an area completely overlapping the display area DA and an area overlapping the non-display area NDA.

Hereinafter, in the transparent touch display device 100 according to embodiments of the disclosure, the cathode electrode CE to which the base voltage EVSS is applied is referred to as a display cathode electrode.

The transparent touch display device 100 according to embodiments of the disclosure may include one or more display cathode electrodes. One or more touch cathode electrodes, together with one or more display cathode electrodes, may be disposed in the cathode electrode layer where the display cathode electrodes are disposed.

In other words, the transparent touch display device 100 according to embodiments of the disclosure may include one or more display cathode electrodes and one or more touch cathode electrodes. One or more display cathode electrodes and one or more touch cathode electrodes may be disposed together in the cathode electrode area CA and disposed together in the cathode electrode layer.

In the transparent touch display device 100 according to embodiments of the disclosure, one or more display cathode electrodes and one or more touch cathode electrodes should be electrically separated from each other.

In the transparent touch display device 100 according to the embodiments of the disclosure, one or more display cathode electrodes are the cathode electrodes CE of the light emitting elements ED of the plurality of subpixels SP, and the base voltage EVSS may be applied thereto.

In the transparent touch display device 100 according to embodiments of the disclosure, one or more touch cathode electrodes may function as a touch sensor.

In the transparent touch display device 100 according to embodiments of the disclosure, the cathode division structure may include a first type, a second type, and a third type.

In the transparent touch display device 100 according to embodiments of the disclosure, the first type is a type in which the cathode electrode layer is divided into one display cathode electrode and a plurality of touch cathode electrodes. The second type is a type in which the cathode electrode layer is divided into one touch cathode electrode and a plurality of display cathode electrodes. The third type is a type in which the cathode electrode layer is divided into a plurality of display cathode electrodes and a plurality of touch cathode electrodes.

Figure 5:
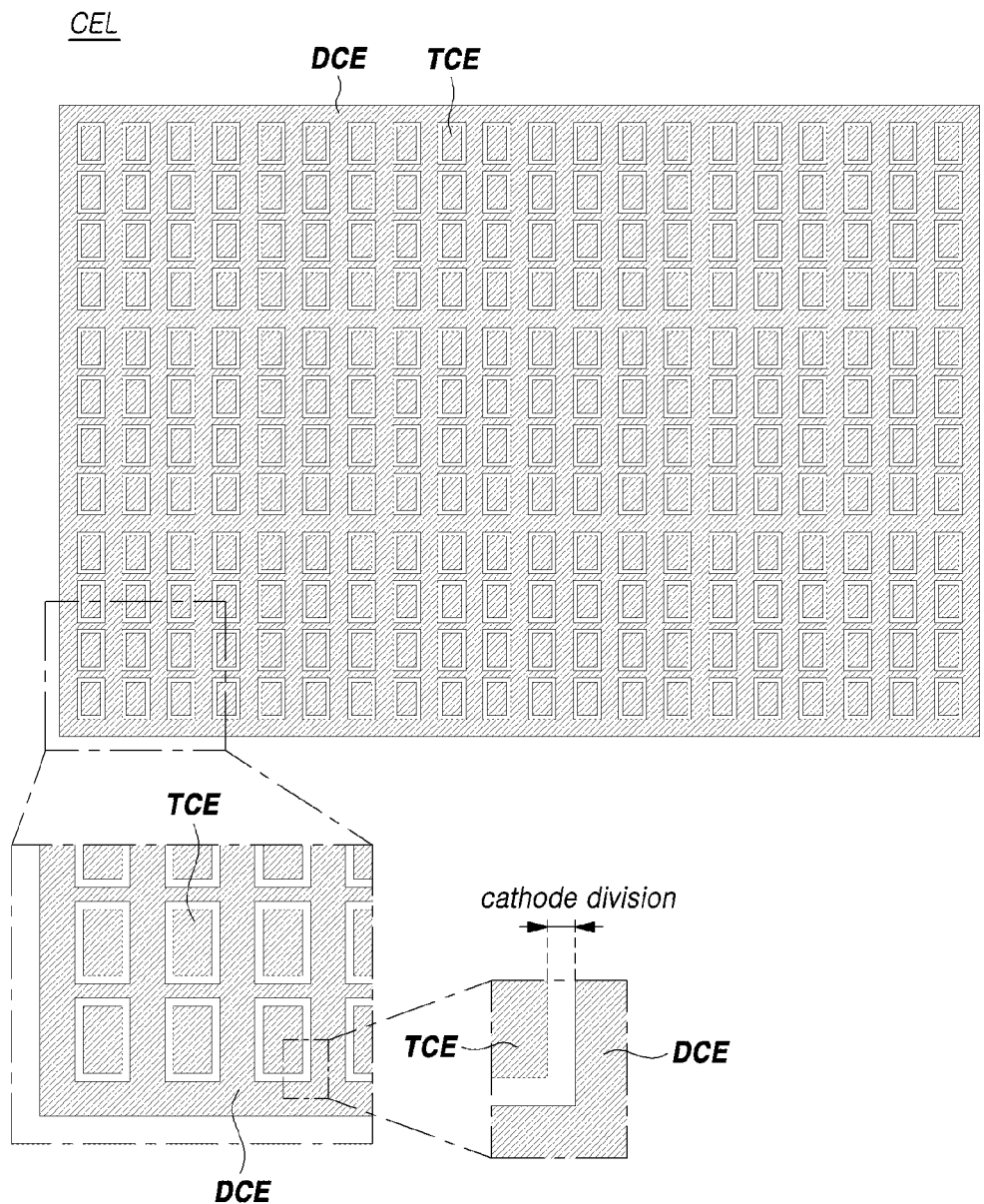
FIG. 5 is a view illustrating a cathode division structure of a display panel of a transparent touch display device according to embodiments of the disclosure.
Figure 8A:
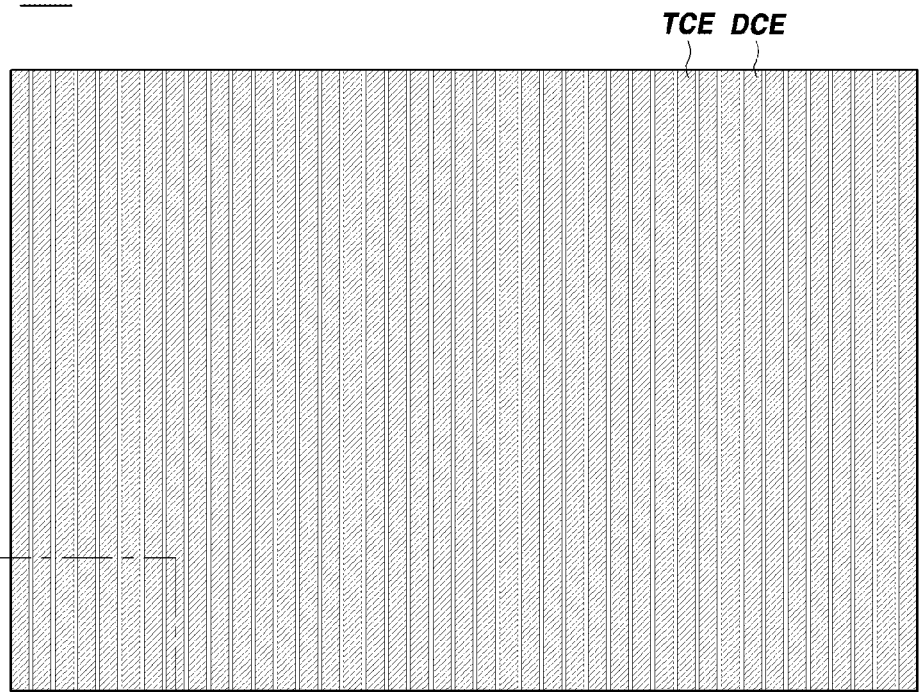
Figure 8B:
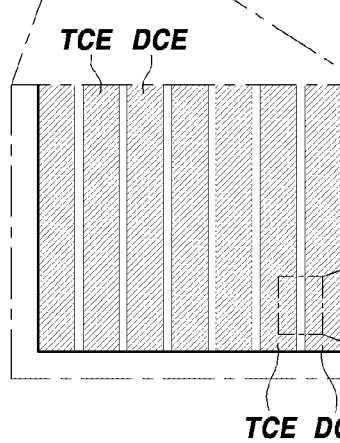
Figure 8C:
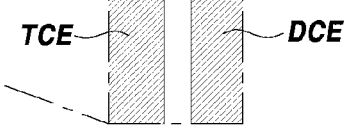

The first type, the second type, and the third type are described herein in greater detail with reference to FIGS. 5, 7, and 8, respectively.

FIG. 5 illustrates a first-type cathode division structure of a display panel 110 of a transparent touch display device 100 according to embodiments of the disclosure.

Referring to FIG. 5, when the transparent touch display device 100 according to embodiments of the disclosure has a first type of cathode division structure, one display cathode electrode DCE and a plurality of touch cathode electrodes TCE may be disposed in the cathode electrode layer CEL. In other words, one display cathode electrode DCE and the plurality of touch cathode electrodes TCE may be formed of the same material.

The lower portion of the underneath layer positioned under the cathode electrode layer CEL has an undercut shape that is recessed inwardly, so that when the cathode electrode material is deposited on the underneath layer, the cathode electrode material is disconnected at the undercut point of the underneath layer. The cathode electrode materials separated with respect to the undercut point correspond to the display cathode electrode DCE and the touch cathode electrode TCE. For example, the underneath layer to which the undercut may be applied may include a pixel electrode layer in which the anode electrode AE is formed, an overcoat layer, or a bank.

One display cathode electrode DCE may correspond to the cathode electrode CE of the light emitting elements ED of the plurality of subpixels SP. A base voltage EVSS may be applied to one display cathode electrode DCE.

The plurality of touch cathode electrodes TCE may be disposed to be spaced apart from each other. The plurality of touch cathode electrodes TCE are disposed adjacent to one display cathode electrode DCE but may be disposed apart from one display cathode electrode DCE. The plurality of touch cathode electrodes TCE may be electrically separated from one display cathode electrode DCE.

Referring to FIG. 5, when the transparent touch display device 100 according to embodiments of the disclosure has a first type of cathode division structure, one display cathode electrode DCE may include a plurality of openings. The plurality of touch cathode electrodes TCE may be positioned in the form of islands in the inner spaces of the plurality of openings formed in one display cathode electrode DCE.

Referring to FIG. 5, the display cathode electrode DCE, which is one type of display driving electrodes, or a portion thereof, may be disposed between two adjacent touch cathode electrodes TCE among the plurality of touch cathode electrodes TCE.

Referring to FIG. 5, one or more subpixels or light emitting areas thereof may be disposed between two adjacent touch cathode electrodes TCE among the plurality of touch cathode electrodes TCE.

The area (size) of each of the plurality of touch cathode electrodes TCE may be equal to the area (size) of one subpixel SP or its area.

Alternatively or additionally, the area (size) of each of the plurality of touch cathode electrodes TCE may be larger than the area (size) of one subpixel SP or its area. For example, the area (size) of each of the plurality of touch cathode electrodes TCE may correspond to the area (size) of two or more subpixels SP or their areas.

Figure 6A:
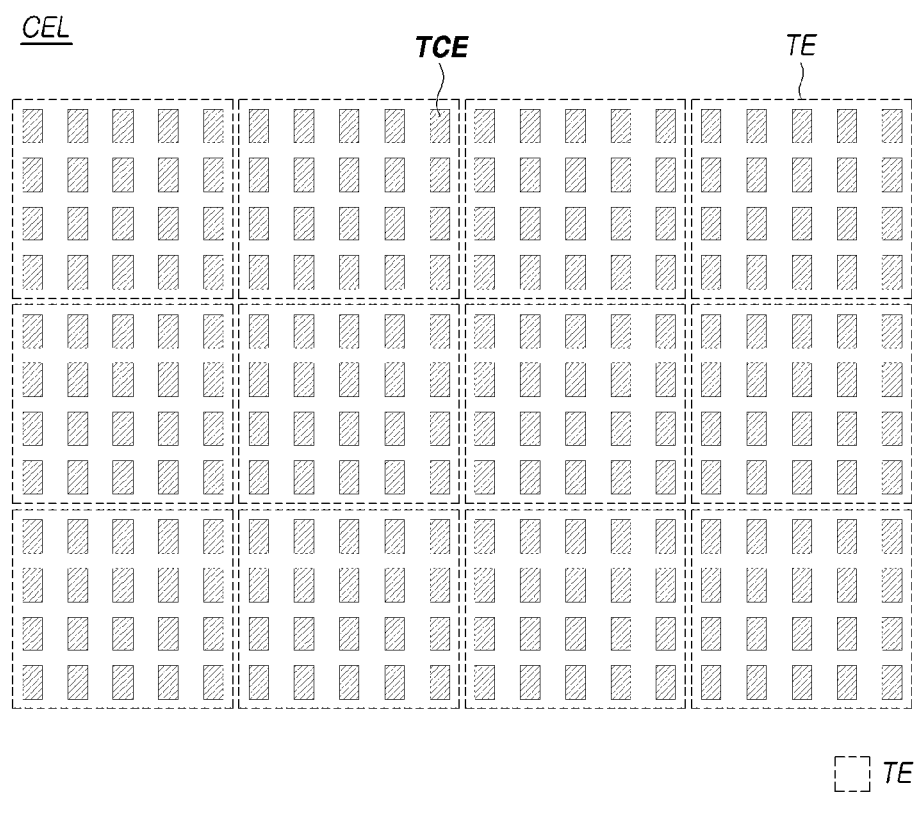
FIGS. 6A, 6B, and 6C are views illustrating a touch sensor structure in a cathode division structure of a display panel of a transparent touch display device according to embodiments of the disclosure.
Figure 6B:
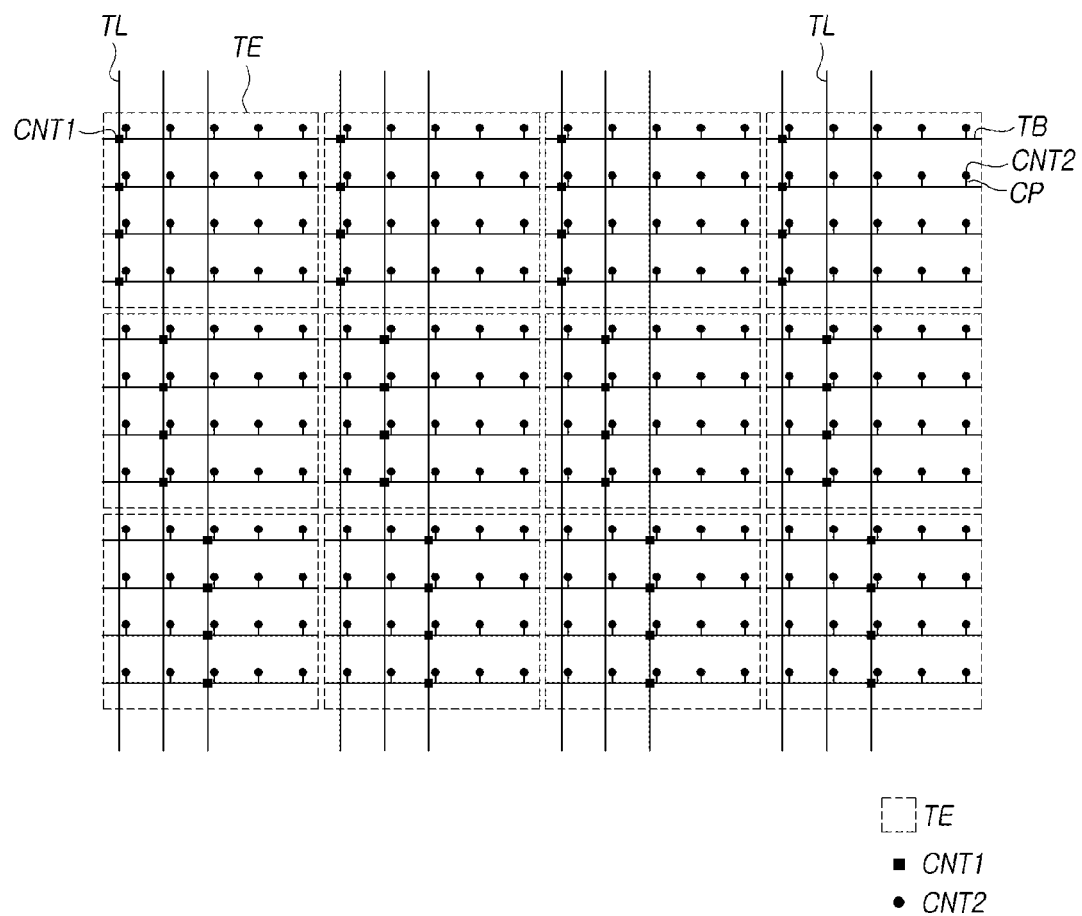
Figures 1, 2, 3, 6C:
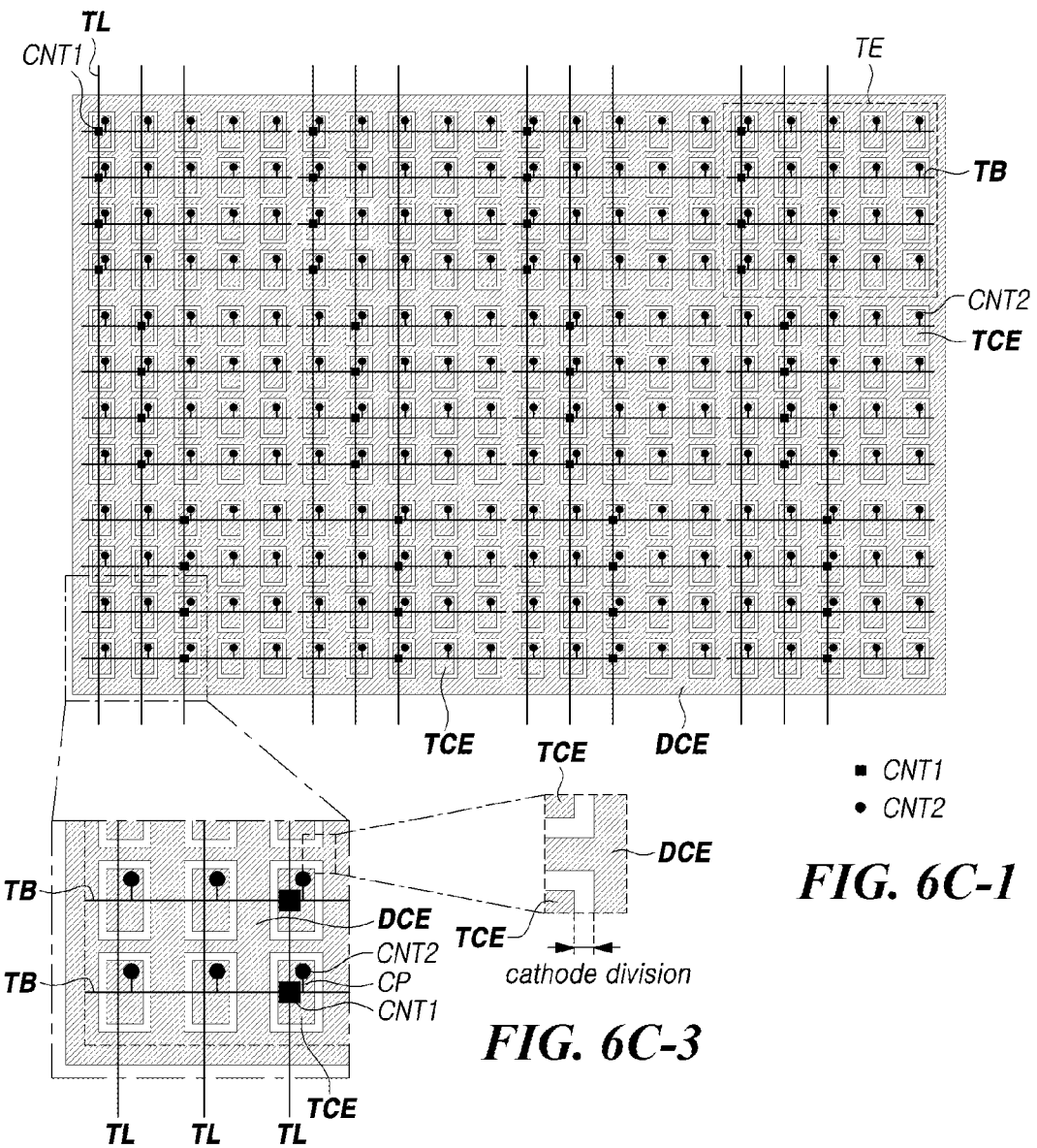

FIGS. 6A, 6B, and 6C illustrate a touch sensor structure when a transparent touch display device 100 according to embodiments of the disclosure has a first type of cathode division structure. However, for convenience of description, FIG. 6A illustrates a plurality of touch cathode electrodes TCE alone, with the display cathode electrode DCE left out.

Referring to FIG. 6A, the plurality of touch cathode electrodes TCE may be grouped into a plurality of groups. The plurality of groups correspond to the plurality of touch electrodes TE. In other words, the transparent touch display device 100 according to embodiments of the disclosure may include a plurality of touch electrodes TE. One touch electrode TE may include two or more touch cathode electrodes TCE.

According to the example of FIG. 6A, the display panel 110 may include 12 touch electrodes TE arranged in three rows and four columns. One touch electrode TE may include 20 touch cathode electrodes TCE arranged in four rows and five columns. Examples thereof are described herein.

For a normal touch sensing operation, the 20 touch cathode electrodes TCE are required to be electrically connected to each other to operate as one touch electrode TE.

For a normal touch sensing operation, in the display panel 110, each of the plurality of touch electrodes TE may be electrically separated from another. In some cases, some of the plurality of touch electrodes TE may be electrically connected inside the touch driving circuit 160. This may be used during group driving (or group sensing) for simultaneously sensing two or more touch electrodes TE.

As described herein, for a normal touch sensing operation, the plurality of touch electrodes TE are required to be electrically separated from each other in the display panel 110 while each of the plurality of touch electrodes TE should be electrically connected to the touch driving circuit 160.

Such connection structure is described in view of touch cathode electrodes TCE. Two or more touch cathode electrodes TCE disposed in the area of one touch electrode TE should be electrically connected with each other. Two or more touch cathode electrodes TCE disposed in the area of one touch electrode TE and two or more touch cathode electrodes TCE disposed in the area of another touch electrode TE should be electrically separated from each other. Two or more touch cathode electrodes TCE disposed in the area of each touch electrode TE should be electrically connected to the touch driving circuit 160.

FIG. 6B illustrates only additional connection structures TL, TB, CP, CNT1, and CNT2 disposed in the cathode electrode area CA to form a touch sensor structure. However, for convenience of description, the cathode electrode layer CEL is omitted in FIG. 6B. FIG. 6C is a plan view illustrating altogether the cathode electrode layer CEL of FIG. 5 and the connection structures TL, TB, CP, CNT1, and CNT2 of FIG. 6B.

Referring to FIGS. 6B and 6C, to form a touch sensor structure according to the connection structure described herein, the display panel 110 may include a plurality of touch lines TL and a plurality of touch bridges TB.

Referring to FIGS. 6B and 6C, the plurality of touch lines TL may respectively correspond to the plurality of touch electrodes TE. The plurality of touch electrodes TE may be connected to the touch driving circuit 160 through the plurality of touch lines TL.

Referring to FIGS. 6B and 6C, at least one touch bridge TB may be disposed in the area of each of the plurality of touch electrodes TE. In other words, at least one touch bridge TB may be disposed in the area of one touch electrode TE.

A touch sensor structure of one touch electrode TE is described with reference to the examples of FIGS. 6B and 6C.

Referring to the example of FIGS. 6B and 6C, one touch electrode TE may include 20 touch cathode electrodes TCE, and the 20 touch cathode electrodes TCE are arranged in four rows and five columns. In other words, one touch electrode TE may include first to fourth touch cathode electrode rows. Each of the first to fourth touch cathode electrode rows includes five touch cathode electrodes TCE.

Referring to the example of FIGS. 6B and 6C, four touch bridges TB are disposed in the area of one touch electrode TE. The four touch bridges TB respectively correspond to the first to fourth touch cathode electrode rows. The five touch cathode electrodes TCE included in each of the first to fourth touch cathode electrode rows may be electrically connected to each other by one touch bridge TB.

Referring to the example of FIGS. 6B and 6C, a plurality of touch lines TL may be disposed to cross the area where one touch electrode TE is formed. One touch line TL of the plurality of touch lines TL may be electrically connected to the first to fourth touch cathode electrode rows through four first contact holes CNT1.

Referring to the example of FIGS. 6B and 6C, each of the four touch bridges TB disposed in the area of one touch electrode TE may correspond to five protruding connection patterns CP. One touch bridge TB may be electrically connected to five touch cathode electrodes TCE through the five protruding connection patterns CP.

Referring to FIGS. 6B and 6C, the five protruding connection patterns CP in one touch bridge TB may be respectively connected to the five touch cathode electrodes TCE through five second contact holes CNT2.

Referring to FIGS. 6B and 6C, the first contact hole CNT1 may be a point connecting the touch line TL and the touch bridge TB, and the second contact hole CNT2 may be a point connecting the touch bridge TB and the touch cathode electrode TCE. All of the 20 touch cathode electrodes TCE may be electrically connected to one touch line TL by the four first contact holes CNT1 and the 20 second contact holes CNT2.

FIG. 7 illustrates a second-type cathode division structure of a display panel 110 of a transparent touch display device 100 according to embodiments of the disclosure.

Referring to FIG. 7, in the transparent touch display device 100 according to embodiments of the disclosure, the second type is a type in which the cathode electrode layer CEL is divided into one touch cathode electrode TCE and a plurality of display cathode electrodes DCE.

Referring to FIG. 7, when the transparent touch display device 100 according to embodiments of the disclosure has a second type of cathode division structure, one touch cathode electrode TCE and a plurality of display cathode electrodes DCE may be disposed. One touch cathode electrode TCE and the plurality of display cathode electrodes DCE may be formed of the same material (cathode electrode material).

The plurality of display cathode electrodes DCE may correspond to the cathode electrode CE of the light emitting elements ED of the plurality of subpixels SP. A base voltage EVSS may be applied to the plurality of display cathode electrodes DCE.

The plurality of display cathode electrodes DCE are disposed adjacent to one touch cathode electrode TCE, but may be disposed apart from the touch cathode electrode TCE. The plurality of display cathode electrodes DCE may be electrically separated from one touch cathode electrode TCE.

Referring to FIG. 7, when the transparent touch display device 100 according to embodiments of the disclosure has a second type of cathode division structure, one touch cathode electrode TCE may include a plurality of openings. The plurality of display cathode electrodes DCE may be positioned in the form of islands in the inner spaces of the plurality of openings formed in one touch cathode electrode TCE.

FIG. 8 illustrates a third-type cathode division structure of a display panel 110 of a transparent touch display device 100 according to embodiments of the disclosure.

Referring to FIG. 8, in the transparent touch display device 100 according to embodiments of the disclosure, the third type is a type in which the cathode electrode layer CEL is divided into a plurality of touch cathode electrodes TCE and a plurality of display cathode electrodes DCE.

Referring to FIG. 8, when the transparent touch display device 100 according to embodiments of the disclosure has a third type of cathode division structure, a plurality of touch cathode electrodes TCE and a plurality of display cathode electrodes DCE may alternately be disposed.

Referring to FIG. 8, each of the plurality of touch cathode electrodes TCE and the plurality of display cathode electrodes DCE may have a bar shape. The plurality of touch cathode electrodes TCE and the plurality of display cathode electrodes DCE may be formed of the same material (cathode electrode material).

The plurality of display cathode electrodes DCE may correspond to the cathode electrode CE of the light emitting elements ED of the plurality of subpixels SP. A base voltage EVSS may be applied to the plurality of display cathode electrodes DCE.

Each of the plurality of display cathode electrodes DCE is adjacent to the touch cathode electrodes TCE on two opposite sides thereof but should be disposed apart from the touch cathode electrode TCE. In other words, the plurality of display cathode electrodes DCE may be electrically separated from the plurality of touch cathode electrodes TCE.

When the transparent touch display device 100 according to embodiments of the disclosure has the first type of cathode division structure of FIG. 5, since one display cathode electrode DCE is used to drive the display, a base voltage EVSS, which is a kind of common voltage, may be uniformly supplied to all of the subpixels SP. Therefore, image quality may be enhanced.

When the transparent touch display device 100 according to embodiments of the disclosure has the second type of cathode division structure of FIG. 7, since one touch cathode electrode TCE is used for touch driving, the touch bridges TB do not need to be disposed in the display panel 110. Thus, the structure of the display panel 110 may be simplified.

When the transparent touch display device 100 according to embodiments of the disclosure has the third type of cathode division structure of FIG. 8, since the border between the touch cathode electrode TCE and the display cathode electrode DCE is in a straight line, the undercut process may be simplified.

Figure 9:
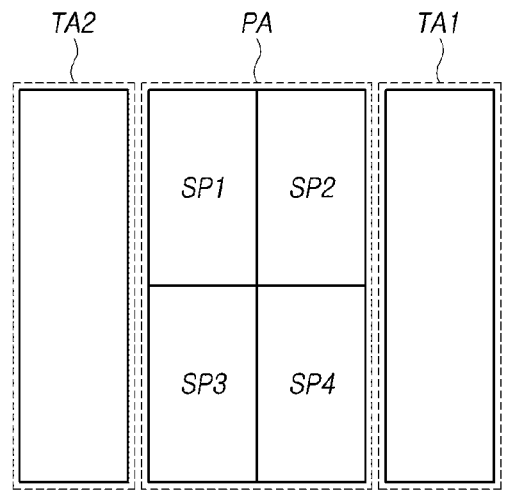
FIG. 9 is a view illustrating a pixel area and a transmissive area in a portion of a display panel of a transparent touch display device according to embodiments of the disclosure.

FIG. 9 illustrates a pixel area PA and transmissive areas TA1 and TA2 in a portion of the display panel 110 of the transparent touch display device 100 according to embodiments of the disclosure.

Referring to FIG. 9, a portion of the display panel 110 of the transparent touch display device 100 according to embodiments of the disclosure may include a pixel area PA, a first transmissive area TA1, and a second transmissive area TA2.

Referring to FIG. 9, the first transmissive area TA1 may be positioned on a first side of the pixel area PA, and the second transmissive area TA2 may be positioned on a second side of the pixel area PA.

Referring to FIG. 9, two or more subpixels SP1, SP2, SP3, and SP4 may be disposed in the pixel area PA between the first transmissive area TA1 and the second transmissive area TA2.

According to the example of FIG. 9, four subpixels SP1, SP2, SP3, and SP4 may be disposed in the pixel area PA between the first transmissive area TA1 and the second transmissive area TA2. The four subpixels SP1, SP2, SP3, and SP4 may include a subpixel emitting red light, a subpixel emitting green light, a subpixel emitting blue light, and a subpixel emitting white light.

Figure 10:
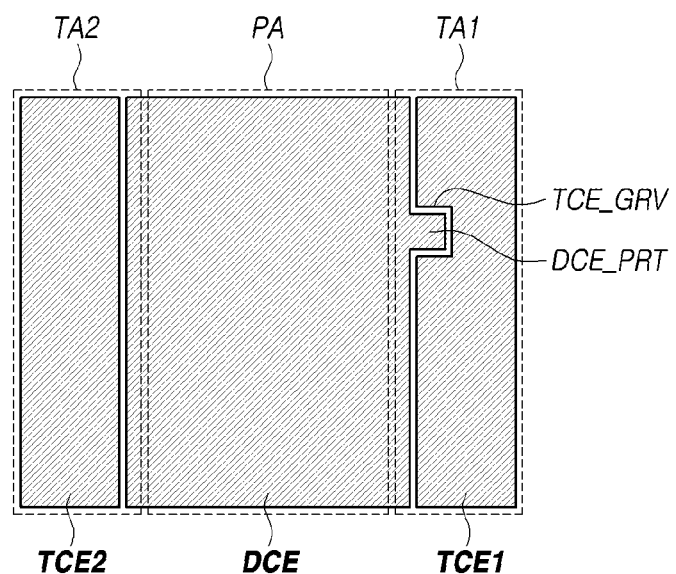
FIG. 10 is a view illustrating a display cathode electrode and a touch cathode electrode respectively disposed in a pixel area and a transmissive area in a portion of a display panel of a transparent touch display device according to embodiments of the disclosure.

FIG. 10 illustrates a display cathode electrode DCE and touch cathode electrodes TCE1 and TCE2 respectively disposed in the pixel area PA and transmissive areas TA1 and TA2 in a portion of the display panel 110 of the transparent touch display device 100 according to embodiments of the disclosure.

Referring to FIG. 10, a display cathode electrode DCE to which a base voltage EVSS for display driving is applied may be disposed in the pixel area PA. A first touch cathode electrode TCE1 may be disposed in the first transmissive area TA1, and a second touch cathode electrode TCE2 may be disposed in the second transmissive area TA2.

The first touch cathode electrode TCE1 and the second touch cathode electrode TCE2 may have the same shape or the same area.

One of the first touch cathode electrode TCE1 and the second touch cathode electrode TCE2 may have a different shape or different area from the other.

Referring to FIG. 10, as an example, the display cathode electrode DCE may include an electrode protrusion DCE_PRT. In this case, the first touch cathode electrode TCE1 may include an electrode groove TCE_GRV in which the electrode protrusion DCE_PRT of the display cathode electrode DCE is interposed.

The electrode protrusion DCE_PRT of the display cathode electrode DCE and the electrode groove TCE_GRV of the first touch cathode electrode TCE1 may be electrically separated from each other.

The electrode protrusion DCE_PRT of the display cathode electrode DCE may be disposed to invade (i.e., extend to) the first transmissive area TA1.

Referring to FIG. 10, a first side portion of the display cathode electrode DCE may be disposed to invade a partial area of the first transmissive area TA. A second side portion of the display cathode electrode DCE may be disposed to invade a partial area of the second transmissive area TA.

Figure 11:
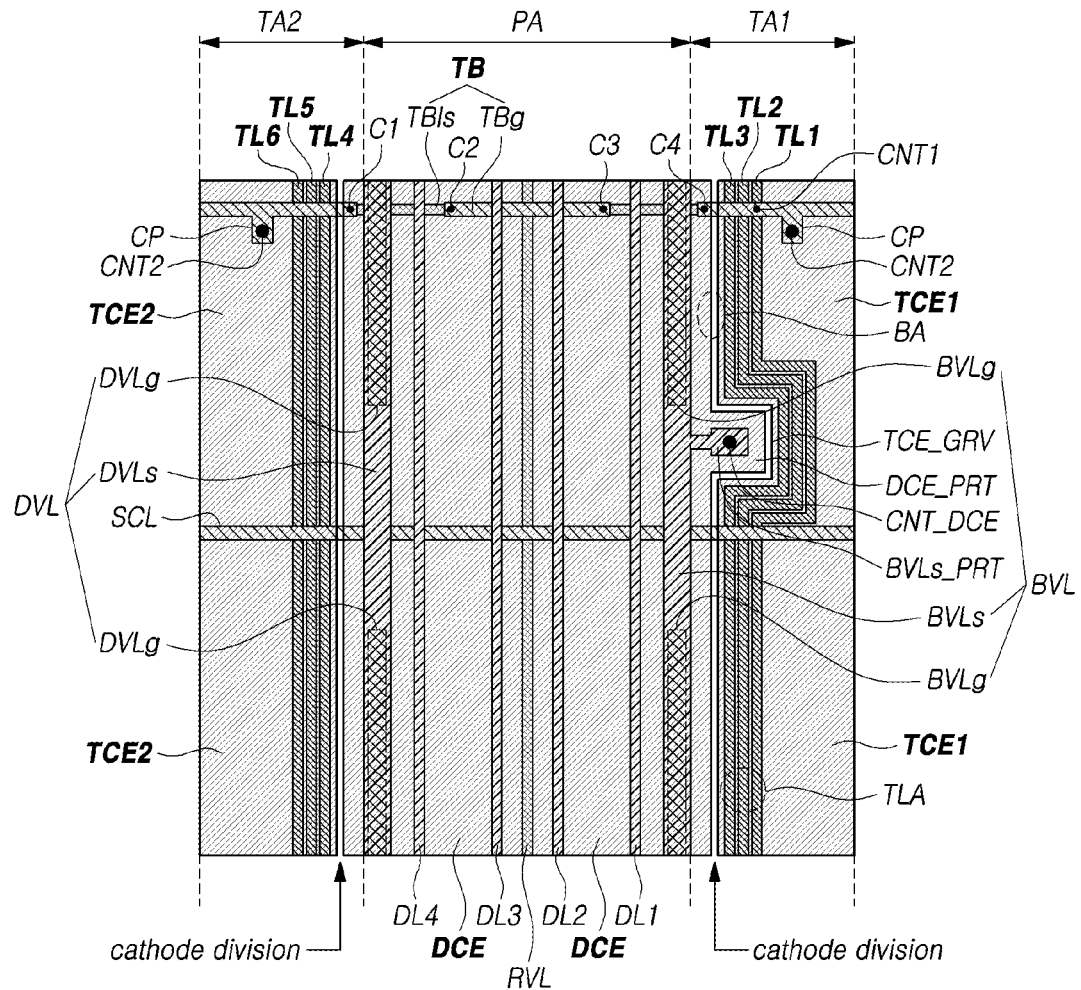
FIG. 11 is a plan view illustrating a display panel of a transparent touch display device according to embodiments of the disclosure.

FIG. 11 is a plan view illustrating a display panel 110 of a transparent touch display device 100 in FIG. 1 according to embodiments of the disclosure.

Referring to FIG. 11, the display panel 110 of the transparent touch display device 100 according to embodiments of the disclosure may include a display cathode electrode DCE disposed in the pixel area PA, a first touch cathode electrode TCE1 disposed in the first transmissive area TA1, and a second touch cathode electrode TCE2 disposed in the second transmissive area TA2.

Referring to FIG. 11, a first side portion of the display cathode electrode DCE may be disposed to invade a partial area of the first transmissive area TA1. A second side portion of the display cathode electrode DCE may be disposed to invade a partial area of the second transmissive area TA2.

Referring to FIG. 11, the display panel 110 of the transparent touch display device 100 according to embodiments of the disclosure may further include a plurality of touch lines TL1, TL2, and TL3 overlapping the first touch cathode electrode TCE1 and a plurality of touch lines TL4, TL5, and TL6 overlapping the second touch cathode electrode TCE2.

Referring to FIG. 11, the first touch cathode electrode TCE1 and the second touch cathode electrode TCE2 may constitute one first touch electrode TE to which a touch driving signal is simultaneously applied.

Referring to FIG. 11, one first touch electrode TE may be electrically connected with the touch pad TP through one first touch line TL1 among the plurality of touch lines TL1, TL2, and TL3 overlapping the first touch cathode electrode TCE1. In other words, the first touch cathode electrode TCE1 and the second touch cathode electrode TCE2 may be electrically connected with the touch pad TP through one first touch line TL1 among the plurality of touch lines TL1, TL2, and TL3 overlapping the first touch cathode electrode TCE1.

Referring to FIG. 11, the other touch lines TL2 and TL3 except for the first touch line TL1 among the plurality of touch lines TL1, TL2, and TL3 overlapping the first touch cathode electrode TCE1 are not electrically connected with the first touch cathode electrode TCE1 and may be electrically connected with another touch cathode electrode TCE where the first touch cathode electrode TCE1 and the second touch cathode electrode TCE2 are electrically separated from each other.

Referring to FIG. 11, none of the plurality of touch lines TL4, TL5, and TL6 overlapping the second touch cathode electrode TCE2 are electrically connected with the second touch cathode electrode TCE2 and, the plurality of touch lines TL4, TL5, and TL6 may be electrically connected with another touch cathode electrode TCE where the first touch cathode electrode TCE1 and the second touch cathode electrode TCE2 are electrically separated from each other.

The display cathode electrode DCE, the first touch cathode electrode TCE1, and the second touch cathode electrode TCE2 may be cathode electrode materials disconnected by an undercut of the underneath layer positioned under the cathode electrode layer CEL. Accordingly, the display cathode electrode DCE, the first touch cathode electrode TCE1, and the second touch cathode electrode TCE2 may be formed of the same cathode electrode material. For example, the cathode electrode material may include a transparent conductive material.

Referring to FIG. 11, the first touch line TL1 may be electrically connected to the first touch cathode electrode TCE1 or the second touch cathode electrode TCE2.

For example, the first touch line TL1 may be electrically connected to the first touch cathode electrode TCE1 through the first touch bridge TB. More specifically, as the first touch line TL1 may be electrically connected to the first touch bridge TB through the first contact hole CNT1, and the protruding connection pattern CP of the first touch bridge TB is electrically connected to the first touch cathode electrode TCE1 through the second contact hole CNT2, the first touch line TL1 may be electrically connected to the first touch cathode electrode TCE1 through the first touch bridge TB.

When the transparent touch display device 100 according to embodiments of the disclosure has the first type of cathode division structure of FIG. 5, the display cathode electrode DCE may include a plurality of openings. The first touch cathode electrode TCE1 may be disposed in the inner space of a first opening among the plurality of openings of the display cathode electrode DCE, and the second touch cathode electrode TCE2 may be disposed in the inner space of a second opening among the plurality of openings of the display cathode electrode DCE.

When the transparent touch display device 100 according to embodiments of the disclosure has the second type of cathode division structure of FIG. 7, the first touch cathode electrode TCE1 and the second touch cathode electrode TCE2 may be portions of an integral touch cathode electrode TCE, and the touch cathode electrode TCE may include a plurality of openings. The display cathode electrode DCE may be disposed in the inner space of one of the plurality of openings of the touch cathode electrode TCE.

When the transparent touch display device 100 according to embodiments of the disclosure has the third type of cathode division structure of FIG. 8, the display cathode electrode DCE may be positioned on a first side of the first touch cathode electrode TCE1, and another display cathode electrode DCE may be disposed on a second side, opposite to the first side, of the first touch cathode electrode TCE1 and be disposed separately from the display cathode electrode DCE.

Referring to FIG. 11, the display panel 110 of the transparent touch display device 100 according to embodiments of the disclosure may further include a first scan signal line SCL disposed to cross the first transmissive area TA1, the pixel area PA, and the second transmissive area TA2.

Referring to FIG. 11, the display panel 110 of the transparent touch display device 100 according to embodiments of the disclosure may further include a first touch bridge TB that electrically connects the first touch cathode electrode TCE1 and the second touch cathode electrode TCE2, across the pixel area PA.

Referring to FIG. 11, in the display panel 110 of the transparent touch display device 100 according to embodiments of the disclosure, the first touch bridge TB may cross the first touch line TL1, and the first touch line TL1 may be electrically connected to the first touch bridge TB through the first contact hole CNT1.

Referring to FIG. 11, the first touch bridge TB may include a first partial bridge TBls including a first metal and a second partial bridge TBg including a second metal different from the first metal.

For example, the first metal may be the same metal (hereinafter, referred to as a light shield metal) as a light shield positioned under the driving transistor DRT disposed in the pixel area PA. The second metal may be a gate metal constituting the gate electrode of the driving transistor DRT or the first scan signal line SCL or constituting various signal lines. The second metal may be positioned in a layer higher than the first metal, i.e., farther away from the substrate.

Referring to FIG. 11, the first partial bridge TBls and the second partial bridge TBg constituting the first touch bridge TB may be positioned in different layers and may be electrically connected to each other through the plurality of contact holes C1, C2, C3, and C4.

Referring to FIG. 11, the first touch line TL1 may include the first metal, and the first scan signal line SCL may include the second metal. The first touch line TL1 may be positioned in a layer lower than the first scan signal line SCL.

The first touch line TL1 may be positioned on any layer, except for the layer where the first touch bridge TB is positioned, among a first metal layer (e.g., a light shield metal layer) where the electrode or line including the first metal is disposed, a second metal layer (e.g., a gate metal layer) where the electrode or line including the second metal is disposed, a third metal layer (e.g., a source-drain metal layer) where the electrode or line including a third metal is disposed, and a fourth metal layer (e.g., a metal layer positioned between the third metal layer and the pixel electrode layer (anode electrode layer)) where the electrode or line including a fourth metal is disposed. The first metal layer, the second metal layer, the third metal layer, and the fourth metal layer may be positioned in the order of the first metal layer, the second metal layer, the third metal layer, and the fourth metal layer from the bottom. Among the first metal layer, the second metal layer, the third metal layer, and the fourth metal layer, the first metal layer may be the lowest layer closest to the substrate SUB, and the fourth metal layer may be the highest layer farthest from the substrate SUB.

Referring to FIG. 11, the first touch line TL1 does not cross the first partial bridge TBls of the first touch bridge TB. The first touch line TL1 may cross the second partial bridge TBg of the first touch bridge TB.

Referring to FIG. 11, the display panel 110 of the transparent touch display device 100 according to embodiments of the disclosure may further include a first data line DL1, a second data line DL2, a third data line DL3, and a fourth data line DL4 disposed in the pixel area PA.

Referring to FIG. 11, each of the first data line DL1, the second data line DL2, the third data line DL3, and the fourth data line DL4 may include the third metal different from the first metal and the second metal.

For example, the first metal may be the same light shield metal as a light shield positioned under the driving transistor DRT disposed in the pixel area PA. The second metal may be a gate metal constituting the gate electrode of the driving transistor DRT or the first scan signal line SCL or constituting various signal lines. The third metal may be a source-drain metal constituting the source electrode and drain electrode of the driving transistor DRT or constituting various signal lines. The third metal layer where the third metal is disposed may be higher than the second metal layer where the second metal is disposed, and the second metal layer where the second metal is disposed may be higher than the first metal layer where the first metal is disposed.

Referring to FIG. 11, each of the first data line DL1, the second data line DL2, the third data line DL3, and the fourth data line DL4 may cross the first partial bridge TBls or second partial bridge TBg of the first touch bridge TB.

Referring to FIG. 11, the display panel 110 of the transparent touch display device 100 according to embodiments of the disclosure may further include a reference voltage line RVL disposed in the pixel area PA.

The reference voltage line RVL may be disposed in the center (center in the column direction) of the pixel area PA. The reference voltage line RVL may overlap the display cathode electrode DCE and may be disposed in the center (center in the column direction) of the display cathode electrode DCE.

The reference voltage line RVL may include the first metal, and the reference voltage line RVL may cross the second partial bridge TBg of the first touch bridge TB.

Referring to FIG. 11, the display panel 110 of the transparent touch display device 100 according to embodiments of the disclosure may further include a base voltage line BVL disposed in the pixel area PA and overlapping the display cathode electrode DCE.

Referring to FIG. 11, the base voltage line BVL may include a first partial base voltage line BVLg including the second metal and a second partial base voltage line BVLs including the third metal different from the first metal and the second metal.

Referring to FIG. 11, the second partial base voltage line BVLs may include a double layer part overlapping the first partial base voltage line BVLg and a single layer part not overlapping the first partial base voltage line BVLg.

Referring to FIG. 11, the first partial base voltage line BVLg may overlap the first partial bridge TBls of the first touch bridge TB. The double layer part of the second partial base voltage line BVLs may overlap the first partial bridge TBls of the first touch bridge TB.

Referring to FIG. 11, the first partial base voltage line BVLg does not cross the first scan signal line SCL, and the second partial base voltage line BVLs may cross the first scan signal line SCL.

Referring to FIG. 11, the base voltage line BVL may be disposed between a first side edge of the display cathode electrode DCE and the reference voltage line RVL.

Referring to FIG. 11, the display panel 110 of the transparent touch display device 100 according to embodiments of the disclosure may further include a driving voltage line DVL disposed in the pixel area PA and overlapping the display cathode electrode DCE.

Referring to FIG. 11, the driving voltage line DVL may include a first partial driving voltage line DVLg including the second metal and a second partial driving voltage line DVLs including the third metal different from the first metal and the second metal.

Referring to FIG. 11, the second partial driving voltage line DVLs may include a double layer part overlapping the first partial driving voltage line DVLg and a single layer part not overlapping the first partial driving voltage line DVLg.

Referring to FIG. 11, the first partial driving voltage line DVLg may overlap the first partial bridge TBls of the first touch bridge TB. The double layer part of the second partial driving voltage line DVLs may overlap the first partial bridge TBls of the first touch bridge TB.

However, the first partial driving voltage line DVLg does not overlap the second partial bridge TBg of the first touch bridge TB, and the double layer part of the second partial driving voltage line DVLs does not overlap the second partial bridge TBg of the first touch bridge TB.

Referring to FIG. 11, the driving voltage line DVL may be disposed between a second side edge of the display cathode electrode DCE and the reference voltage line RVL.

Referring to FIG. 11, the display panel 110 of the transparent touch display device 100 according to embodiments of the disclosure may further include a base voltage line BVL that is disposed in the pixel area PA, overlaps the display cathode electrode DCE, and is electrically connected with the display cathode electrode DCE.

Referring to FIG. 11, the display cathode electrode DCE may include an electrode protrusion DCE_PRT. The first touch cathode electrode TCE1 may include an electrode groove TCE_GRV in which the electrode protrusion DCE_PRT of the display cathode electrode DCE is interposed. The electrode protrusion DCE_PRT of the display cathode electrode DCE and the electrode groove TCE_GRV of the first touch cathode electrode TCE1 may be electrically separated from each other.

Referring to FIG. 11, the base voltage line BVL may include a line protrusion BVLs_PRT overlapping the electrode protrusion DCE_PRT of the display cathode electrode DCE. The line protrusion BVLs_PRT of the base voltage line BVL may be electrically connected to the electrode protrusion DCE_PRT of the display cathode electrode DCE through a display cathode contact pattern CNT_DCE.

Referring to FIG. 11, the first touch line TL1 may overlap the first touch cathode electrode TCE1 and be bent along the electrode groove TCE_GRV of the first touch cathode electrode TCE1.

Referring to FIG. 11, the display panel 110 of the transparent touch display device 100 according to embodiments of the disclosure may further include other touch lines TL4, TL5, and TL6 disposed in the second transmissive area TA2, crossing the first touch bridge TB, and overlapping the second touch cathode electrode TCE2.

Figure 12:
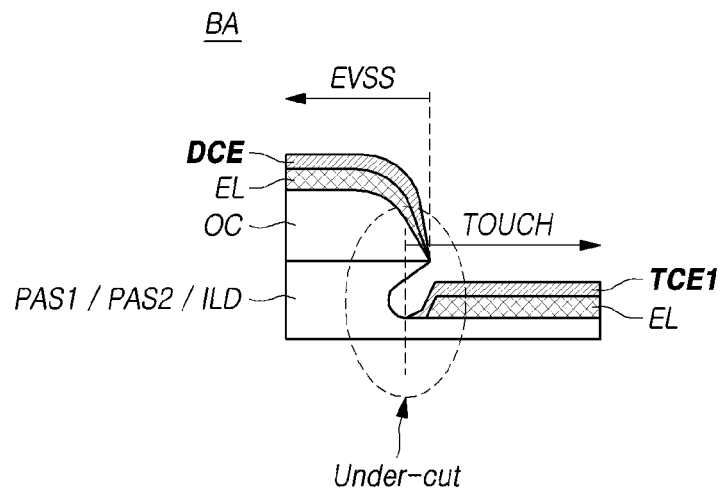
FIG. 12 is a cross-sectional view illustrating a cathode split border area in a display panel of a transparent touch display device according to embodiments of the disclosure.

FIG. 12 is a cross-sectional view illustrating the cathode division border area BA of FIG. 11 in the display panel 110 of the transparent touch display device 100 according to embodiments of the disclosure.

When the display panel 110 of the transparent touch display device 100 according to embodiments of the disclosure has a cathode division structure, the display cathode electrode DCE, the first touch cathode electrode TCE1, and the second touch cathode electrode TCE2 may be cathode electrode materials disconnected by an undercut of an underneath layer positioned under the cathode electrode layer CEL.

For example, the underneath layer to which the undercut may be applied may include a pixel electrode layer where the anode electrode AE is formed, an overcoat layer, or a bank and, in some cases, may include at least one of a first passivation film PAS1, a second passivation film PAS2, and an inter-layer insulation film ILD.

According to the undercut structure of the underneath layer described herein, the display cathode electrode DCE, the first touch cathode electrode TCE1, and the second touch cathode electrode TCE2 may be formed of the same cathode electrode material. For example, the cathode electrode material may include a transparent conductive material.

In other words, as illustrated in FIG. 12, in the cathode division border area BA of FIG. 11, the underneath layer positioned under the display cathode electrode DCE may have an undercut shape in which the lower portion is recessed inwardly. The cathode division border area BA may be a border area BA between the display cathode electrode DCE and the first touch cathode electrode TCE1.

Likewise, even in the border area between the display cathode electrode DCE and the second touch cathode electrode TCE2, the underneath layer positioned under the display cathode electrode DCE may have an undercut shape in which the lower portion is recessed inwardly.

In other words, when the display panel 110 of the transparent touch display device 100 according to embodiments of the disclosure has a cathode division structure, the display panel 110 may further include an underneath layer positioned under the display cathode electrode DCE.

The underneath layer may have an undercut structure in which the lower portion is recessed inwardly. At the point BA where the underneath layer has the undercut structure, the display cathode electrode DCE and the first touch cathode electrode TCE1 may be electrically separated from each other and, at another point where the underneath layer has an undercut structure, the display cathode electrode DCE and the second touch cathode electrode TCE2 may be electrically separated from each other.

Figure 13:
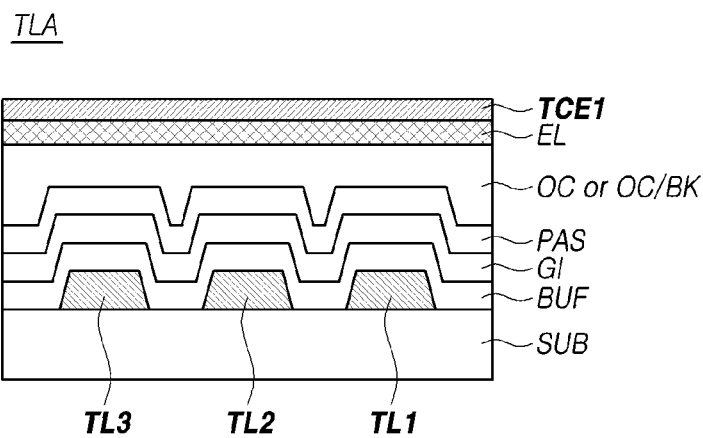
FIG. 13 is a cross-sectional view illustrating a touch line area in a display panel of a transparent touch display device according to embodiments of the disclosure.

FIG. 13 is a cross-sectional view illustrating a touch line area TLA in a display panel 110 of a transparent touch display device 100 according to embodiments of the disclosure.

Referring to FIG. 13, the first touch cathode electrode TCE1 and the second touch cathode electrode TCE2 may be electrically connected by the first touch bridge TB to constitute one first touch electrode TE.

Referring to FIG. 13, in the first transmissive area TA1, the first touch line TL1, the second touch line TL2, and the third touch line TL3 may overlap the first touch cathode electrode TCE1.

Referring to FIGS. 13 and 11 together, among the first touch line TL1, the second touch line TL2, and the third touch line TL3 overlapping the first touch cathode electrode TCE1, only the first touch line TL1 may be electrically connected to the first touch cathode electrode TCE1. Among the first touch line TL1, the second touch line TL2, and the third touch line TL3 overlapping the first touch cathode electrode TCE1, the second touch line TL2 and the third touch line TL3 may not be electrically connected to the first touch cathode electrode TCE1.

Referring to FIG. 13, the first to third touch lines TL1, TL2, and TL3 may be positioned on the light shield metal layer on the substrate SUB, and the buffer layer BUF may be disposed to cover the first to third touch lines TL1, TL2, and TL3. The buffer layer BUF may be a single layer or multiple layers.

Referring to FIG. 13, a gate insulation film GI may be disposed on the buffer layer BUF, and a passivation film PAS may be disposed on the gate insulation film GI. The passivation film PAS may be a single film or multiple films. An overcoat layer OC may be disposed on the passivation film PAS, or a bank BK may be further disposed on the overcoat layer OC.

Referring to FIG. 13, the light emitting layer EL may be positioned on the overcoat layer OC or the bank BK on the overcoat layer OC. The first touch cathode electrode TCE1 may be positioned on the light emitting layer EL.

Referring to FIG. 13, the light emitting layer EL overlapping the first to third touch lines TL1, TL2, and TL3 extends from the pixel area PA, and since there is no anode electrode AE underneath, the light emitting layer EL may not be able to perform the role of light emission.

Figure 14:
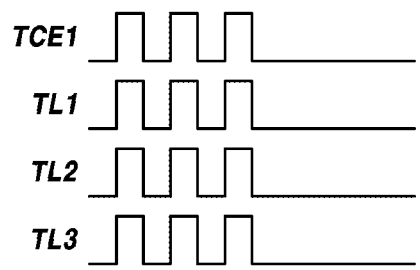
FIG. 14 is a view illustrating signals applied to a touch cathode electrode and a touch line in a display panel of a transparent touch display device according to embodiments of the disclosure.

FIG. 14 illustrates signals applied to the first touch cathode electrode TCE1 and the first to third touch lines TL1, TL2, and TL3 in the display panel 110 of the transparent touch display device 100 according to embodiments of the disclosure.

Referring to FIG. 14, the first touch line TL1 and the first touch cathode electrode TCE1 may have the same electrical state. Further, the second touch line TL2 and the third touch line TL3 may also have the same electrical state as the first touch cathode electrode TCE1.

This is why in the first transmissive area TA1, the first touch line TL1, the second touch line TL2, and the third touch line TL3 overlap the first touch cathode electrode TCE1, and signals with the same signal characteristics are applied to all of the first touch line TL1, the second touch line TL2, the third touch line TL3, and the first touch cathode electrode TCE1. The same signal characteristics may mean that at least one of the frequency, phase, and amplitude is the same.

Specifically, since the touch driving signal output from the touch driving circuit 160 is applied to the first touch cathode electrode TCE1 through the first touch line TL1, the first touch line TL1 and the first touch cathode electrode TCE1 may have the same electrical state. A touch driving signal for touch sensing or a load-free driving signal corresponding to the touch driving signal for reducing parasitic capacitance may be applied to the second touch line TL2 and the third touch line TL3. The load-free driving signal may have the same signal characteristics as the signal characteristics of the touch driving signal. The same signal characteristics may mean that at least one of the frequency, phase, and amplitude is the same. Accordingly, all of the first touch line TL1, the second touch line TL2, the third touch line TL3, and the first touch cathode electrode TCE1 may have the electrical state in which signals having the same signal characteristics are applied thereto.

As shown in FIG. 14, since the first touch line TL1 and the first touch cathode electrode TCE1 have the same electrical state, unnecessary parasitic capacitance between the first touch line TL1 and the first touch cathode electrode TCE1 may be prevented, so that touch sensitivity may be enhanced.

Figure 15:
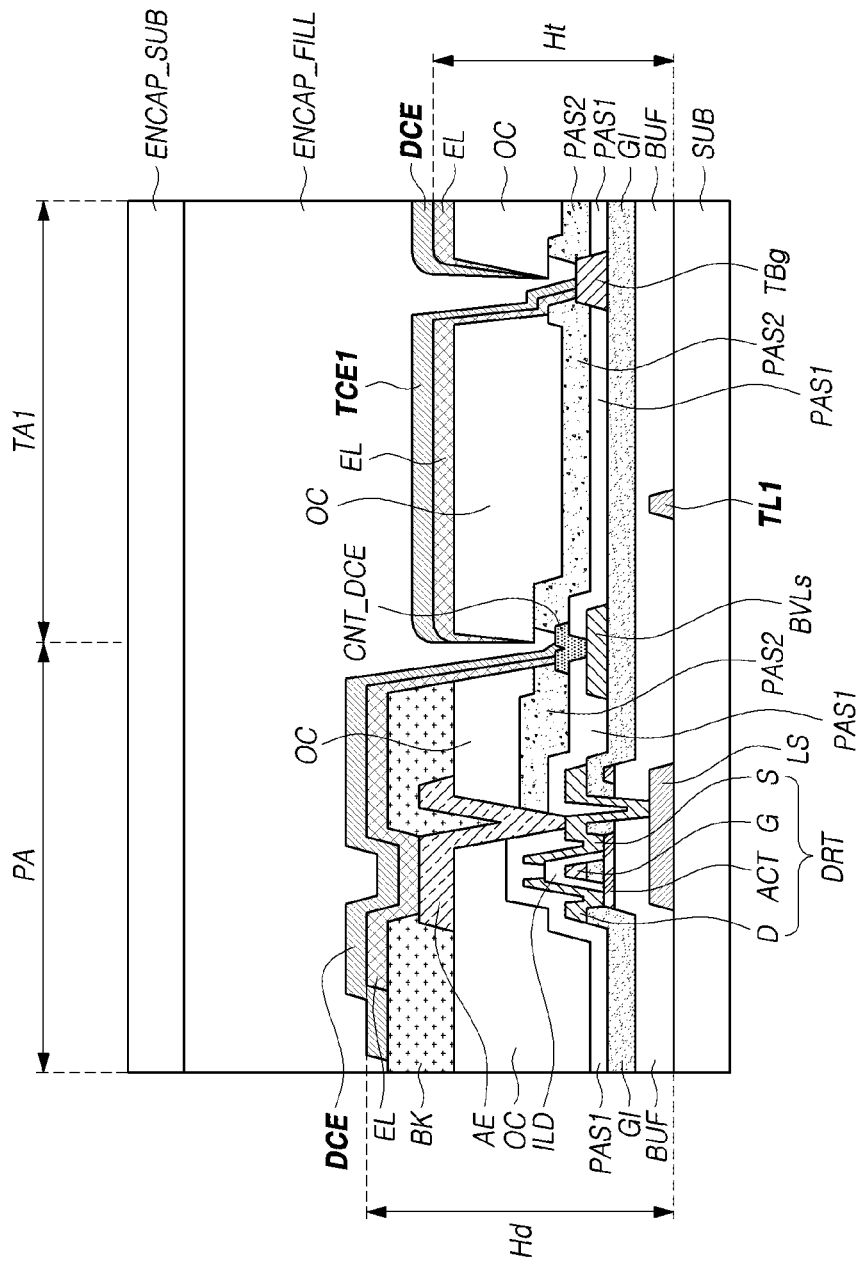
FIG. 15 is a cross-sectional view illustrating a display panel of a transparent touch display device according to embodiments of the disclosure.

FIG. 15 is a cross-sectional view illustrating a display panel 110 of a transparent touch display device 100 according to embodiments of the disclosure. FIG. 15 simply exemplifies the cross-sectional structure for a partial area of the pixel area PA and the first transmissive area TA1 for convenience of description. FIG. 15 illustrates only the first touch line TL1 among the first to third touch lines TL1, TL2, and TL3 overlapping the first touch cathode electrode TCE1 for convenience of description.

Referring to FIG. 15, a driving transistor DRT, an anode electrode AE, and a display cathode electrode DCE may be disposed in the pixel area PA. A first touch cathode electrode TCE1, a first touch line TL1, and a first touch bridge TB (not shown) may be disposed in the first transmissive area TA1.

Referring to FIG. 15, the anode electrode AE may be disposed in the pixel electrode layer (anode electrode layer) in the pixel area PA and may be positioned on the driving transistor DRT and may be electrically connected to the source electrode S or the drain electrode D of the driving transistor DRT. A light emitting layer EL may be positioned between the anode electrode AE and the display cathode electrode DCE.

Referring to FIG. 15, the display panel 110 of the transparent touch display device 100 according to embodiments of the disclosure may further include a light shield LS positioned under the driving transistor DRT and overlapping the active layer ACT of the driving transistor DRT. The layer in which the light shield LS is positioned may be referred to as a light shield metal layer.

The light shield LS may be disposed in the pixel area PA.

The first touch line TL1 overlapping the first touch cathode electrode TCE1 may be positioned in the light shield metal layer. Accordingly, the light shield LS and the first touch line TL1 may include the same material (light shield metal).

FIG. 15 illustrates that the first touch line TL1 is positioned in the first metal layer (light shield metal layer), but may be positioned in various layers. For example, the first touch line TL1 may be positioned in any metal layer, except for the layer where the first touch bridge TB (not shown) is positioned, among the first metal layer (light shield metal layer), the second metal layer (gate metal layer), the third metal layer (source-drain metal layer), and the fourth metal layer (a metal layer positioned between the third metal layer and the pixel electrode layer (anode electrode layer)).

Referring to FIG. 15, the display panel 110 of the transparent touch display device 100 according to embodiments of the disclosure has a top emission structure in which light for image display is emitted to the upper surface of the encapsulation substrate ENCAP_SUB. To this end, the display cathode electrode DCE, the first touch cathode electrode TCE1, and the second touch cathode electrode TCE2 may include the same transparent conductive material, and the anode electrode AE may include a reflective metal material.

A vertical structure of the display panel 110 is described in more detail with reference to FIG. 15.

Referring to FIG. 15, a light shield metal layer, which is the first metal layer, may be positioned on the substrate SUB. The light shield metal layer, which is the first metal layer, is a layer in which the light shield metal, which is the first metal, is disposed, and may be a metal layer closest to the substrate SUB.

Referring to FIG. 15, the light shield LS and the first touch line TL1 may be disposed in the light shield metal layer which is the first metal layer. Further, the first partial bridge TBls of the first touch bridge TB (not shown) may be disposed in the light shield metal layer. The light shield LS, the first touch line TL1, and the first partial bridge TBls of the first touch bridge TB (not shown) may include the light shield metal.

Referring to FIG. 15, the buffer layer BUF may be disposed to cover the light shield LS and the first touch line TL1. The buffer layer BUF may be a single layer or multiple layers.

Referring to FIG. 15, the active layer ACT may be disposed on the buffer layer BUF, and the gate insulation film GI may be disposed to cover the active layer ACT.

Referring to FIG. 15, the gate electrode G and the second partial bridge TBg of the first touch bridge TB may be disposed on the gate insulation film GI. The layer where the gate electrode G and the second partial bridge TBg of the first touch bridge TB are positioned is referred to as a gate metal layer, which is the second metal layer. The gate electrode G and the second partial bridge TBg of the first touch bridge TB may include a gate metal that is the second metal. The first partial base voltage line BVLg of the base voltage line BVL and the first partial driving voltage line DVLg of the driving voltage line DVL may be further disposed in the gate metal layer.

Referring to FIG. 15, the inter-layer insulation film ILD may be disposed on the gate electrode G, and the source electrode S and the drain electrode D containing the third metal as source-drain metal may be disposed on the inter-layer insulation film ILD. Further, the second partial base voltage line BVLs of the base voltage line BVL and the second partial driving voltage line DVLs of the driving voltage line DVL may be further disposed on the source-drain metal layer which is the third metal layer.

Referring to FIG. 15, the source electrode S may be connected to a side of the active layer ACT through the through hole of the gate insulation film GI. The drain electrode D may be connected to another side of the active layer ACT through the through hole of the gate insulation film GI.

Referring to FIG. 15, the source electrode S may be connected to the light shield LS through the through holes of the gate insulation film GI and the buffer layer BUF. Thus, it is possible to stably operate the driving transistor DRT in relation to the body effect.

Referring to FIG. 15, the first passivation film PAS1 may be disposed on the source-drain metal layer. The display cathode contact pattern CNT_DCE may be disposed on the first passivation film PAS1. The layer in which the display cathode contact pattern CNT_DCE is positioned is referred to as the fourth metal layer. The display cathode contact pattern CNT_DCE may be connected to the second partial base voltage line BVLs of the base voltage line BVL through the through hole of the first passivation film PAS1. Referring to FIG. 11, the portion to which the display cathode contact pattern CNT_DCE is connected in the second partial base voltage line BVLs of the base voltage line BVL may correspond to the line protrusion BVLs_PRT of the base voltage line BVL.

Referring to FIG. 15, the second passivation film PAS2 may be disposed to cover the display cathode contact pattern CNT_DCE on the first passivation film PAS1. The metal layer between the first passivation film PAS1 and the second passivation film PAS2 may be the fourth metal layer formed of the fourth metal, and the display cathode contact pattern CNT_DCE may be positioned therein.

Referring to FIG. 15, the overcoat layer OC may be disposed on the first passivation film PAS1 and the second passivation film PAS2. A lower portion of the overcoat layer OC may have an undercut structure.

Referring to FIG. 15, the anode electrode AE may be disposed on the overcoat layer OC, and the anode electrode AE may be connected to the source electrode S of the driving transistor DRT through the through hole of the overcoat layer OC and the first passivation film PAS1.

Referring to FIG. 15, the bank BK may be disposed on the anode electrode AE, and the bank BK may have an opening. The upper surface of a portion of the anode electrode AE may be exposed through the opening of the bank BK. The bank BK may be positioned in the pixel area PA and may not be disposed in the first transmissive area TAL.

Referring to FIG. 15, the light emitting layer EL may be disposed in both the pixel area PA and the first transmissive area TAL. In the pixel area PA, the light emitting layer EL may be disposed on the bank BK, and may be disposed in contact on the anode electrode AE in the opening of the bank BK. In the first transmissive area TA1, the light emitting layer EL may be disposed on the overcoat layer OC.

However, the light emitting layer EL in the pixel area PA and the light emitting layer EL in the first transmissive area TA1 are disconnected from each other in the border area between the pixel area PA and the first transmissive area TA1. In other words, the light emitting layer EL may be disconnected by the undercut structure of the overcoat layer OC in the border area between the pixel area PA and the first transmissive area TA1.

Referring to FIG. 15, the cathode electrode material in the cathode electrode layer CEL in FIG. 7 or FIG. 8 may be positioned on the light emitting layer EL and may be disconnected in the border area between the pixel area PA and the first transmissive area TA1 by the undercut structure of the overcoat layer OC. Accordingly, the cathode electrode material positioned on the light emitting layer EL in the pixel area PA may constitute the display cathode electrode DCE. The cathode electrode material positioned on the light emitting layer EL in the first transmissive area TA1 may constitute the first touch cathode electrode TCE1.

Referring to FIG. 15, in the border area between the pixel area PA and the first transmissive area TA1, the display cathode electrode DCE may be electrically connected to the display cathode contact pattern CNT_DCE through the through hole of the overcoat layer OC and the second passivation film PAS2. Accordingly, the display cathode electrode DCE may be electrically connected to the second partial base voltage line BVLs of the base voltage line BVL through the display cathode contact pattern CNT_DCE.

Referring to FIG. 15, in another border area between the pixel area PA and the first transmissive area TA1, the first touch cathode electrode TCE1 may be electrically connected to the second partial bridge TBg of the first touch bridge TB through the through hole of the overcoat layer OC and the second passivation film PAS2.

Referring to FIG. 15, the display cathode electrode DCE, the first touch cathode electrode TCE1, and the second touch cathode electrode TCE2 may be positioned in the cathode electrode layer CEL, and the encapsulation layer ENCAP may be disposed on the display cathode electrode DCE, the first touch cathode electrode TCE1, and the second touch cathode electrode TCE2 positioned on the cathode electrode layer CEL.

Referring to FIG. 15, the encapsulation layer ENCAP may include an encapsulation substrate, a dam positioned between the thin film transistor array substrate SUB and the encapsulation substrate ENCAP_SUB along the outer edge of the display area DA, and a filler ENCAP_FILL filling the inner space of the dam.

The encapsulation layer ENCAP may be configured in various types. Unlike the type of the encapsulation layer ENCAP of FIG. 15, the encapsulation layer ENCAP may be configured to include one or more inorganic layers and one or more organic layers.

Meanwhile, referring to FIG. 15, the largest spacing Ht between the first touch cathode electrode TCE1 and the substrate SUB and the largest spacing Ht between the second touch cathode electrode TCE2 and the substrate SUB may each be shorter than the largest spacing Hd between the display cathode electrode DCE and the substrate SUB.

FIGS. 16 to 19 are plan views illustrating a display panel 110 of a transparent touch display device 100 in FIG. 1 according to embodiments of the disclosure.

Figure 16:
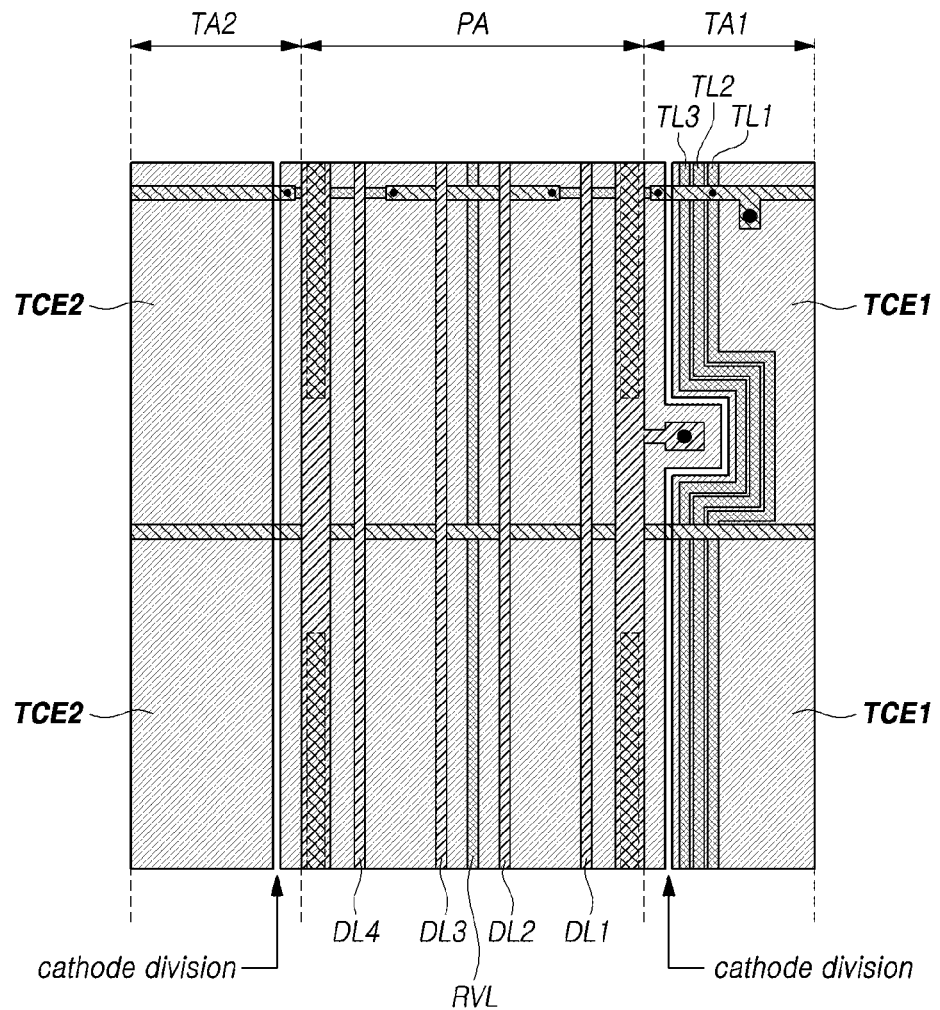
FIGS. 16, 17, 18, and 19 are plan views illustrating a display panel of a transparent touch display device according to embodiments of the disclosure.

Referring to FIG. 16, in relation to the first transmissive area TA1, the display panel 110 may include a plurality of touch lines TL1, TL2, and TL3 overlapping the first touch cathode electrode TCE1. However, in relation to the second transmissive area TA2, the display panel 110 may not include the plurality of touch lines TL4, TL5, and TL6 overlapping the second touch cathode electrode TCE2.

Since the number of touch lines is determined according to the number of touch electrodes, an imbalance in the existence of touch lines in the first transmissive area TA1 and the second transmissive area TA2 may occur as shown in FIG. 16. This may cause a decrease in touch sensitivity.

Figure 17:
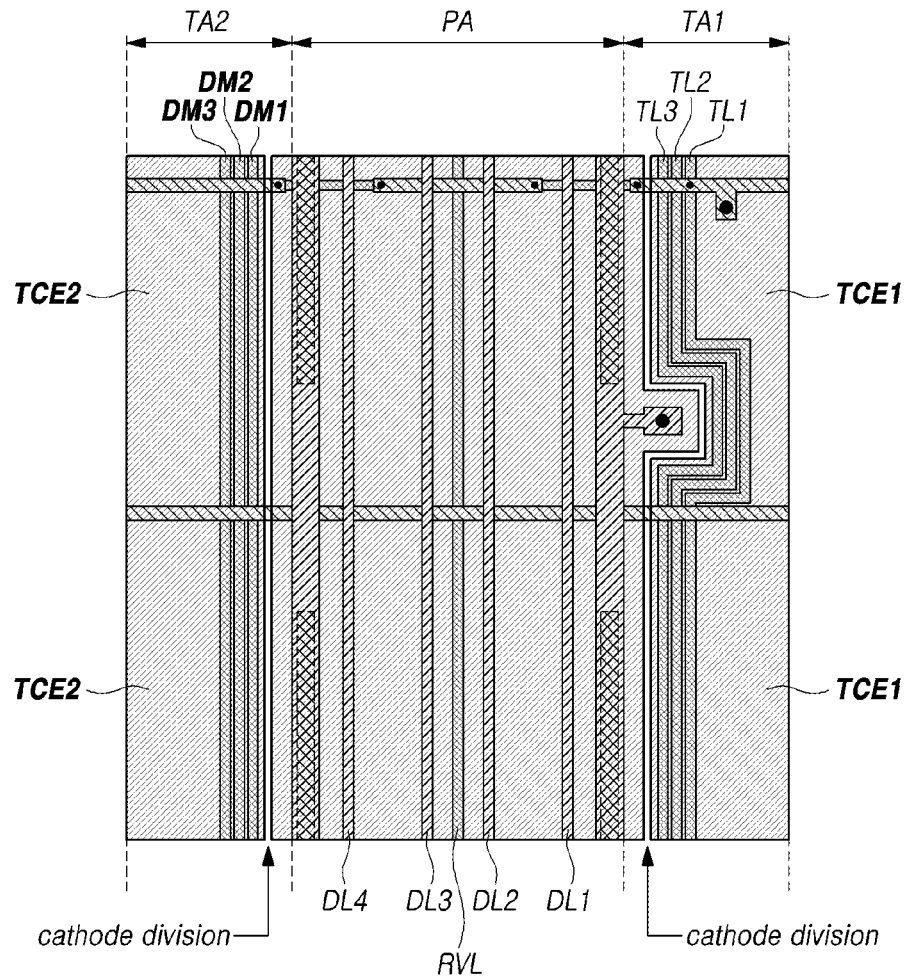

Referring to FIG. 17, there may further be included dummy lines DM1, DM2, and DM3 overlapping the second touch cathode electrode TCE2 to address an imbalance in the existence of touch lines in the first transmissive area TA1 and the second transmissive area TA2.

The number of dummy lines DM1, DM2 and DM3 overlapping the second touch cathode electrode TCE2 may be equal to the number of the plurality of touch lines TL1, TL2, and TL3 overlapping the first touch cathode electrode TCE1.

The dummy lines DM1, DM2, and DM3 overlapping the second touch cathode electrode TCE2 may have a different electrical state from the first touch line TL1, have a floating state, or may not be sensed by the touch driving circuit 160 sensing the first touch line TL1.

Figure 18:
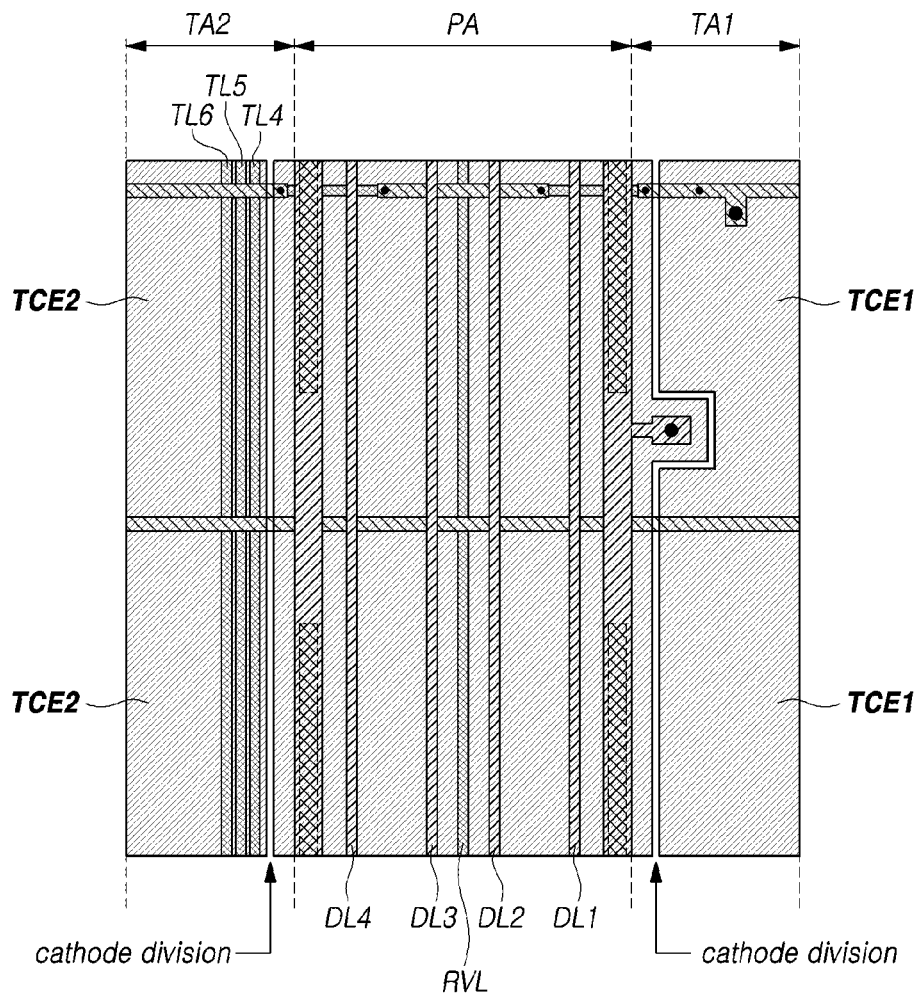

Referring to FIG. 18, in relation to the second transmissive area TA2, the display panel 110 may include a plurality of touch lines TL4, TL5, and TL6 overlapping the second touch cathode electrode TCE2. However, in relation to the first transmissive area TA1, the display panel 110 may not include the plurality of touch lines TL1, TL2, and TL3 overlapping the first touch cathode electrode TCE1.

Since the number of touch lines is determined according to the number of touch electrodes, an imbalance in the existence of touch lines in the first transmissive area TA1 and the second transmissive area TA2 may occur as shown in FIG. 18. This may cause a decrease in touch sensitivity.

Figure 19:
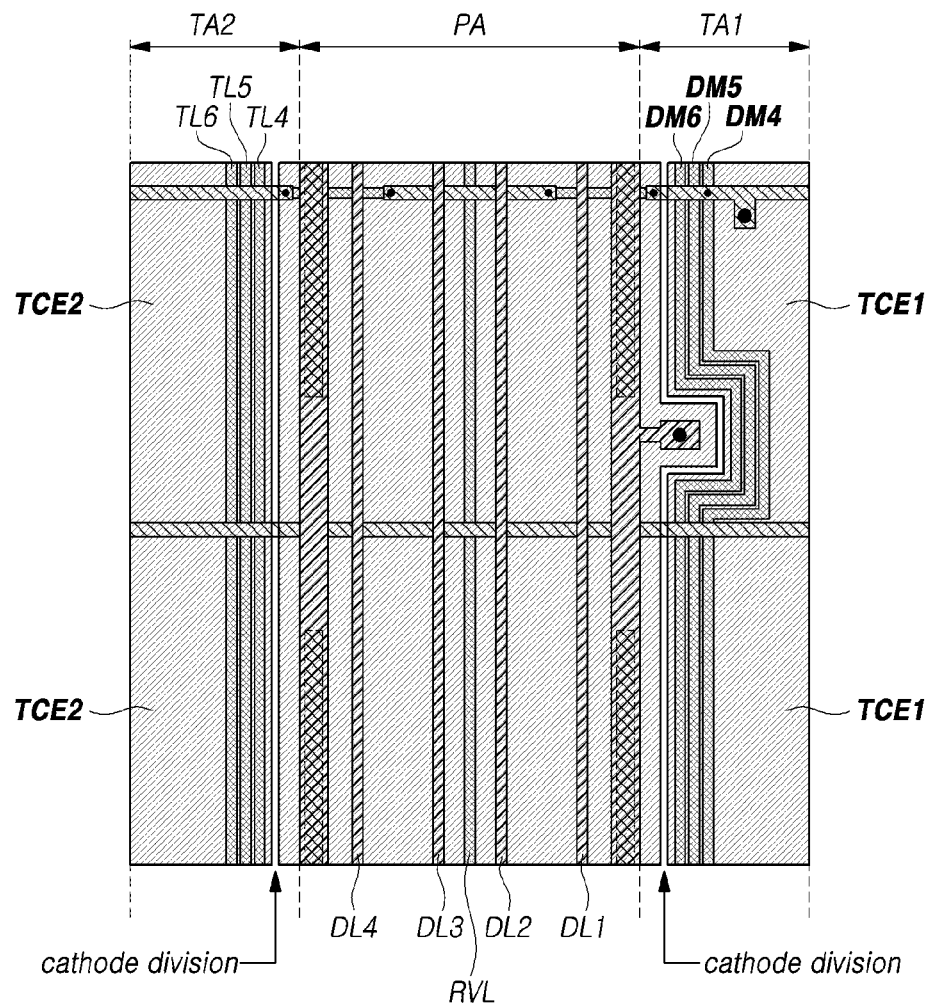

Referring to FIG. 19, there may further be included dummy lines DM4, DM5, and DM6 overlapping the first touch cathode electrode TCE1 to address an imbalance in the existence of touch lines in the first transmissive area TA1 and the second transmissive area TA2.

The number of dummy lines DM4, DM5 and DM6 overlapping the first touch cathode electrode TCE1 may be equal to the number of the plurality of touch lines TL4, TL5, and TL6 overlapping the second touch cathode electrode TCE2.

The dummy lines DM4, DM5, and DM6 overlapping the first touch cathode electrode TCE1 may have different electrical states from the plurality of touch lines TL4, TL5, and TL6 overlapping the second touch cathode electrode TCE2, have a floating state, or be not sensed by the touch driving circuit 160 sensing the plurality of touch lines TL4, TL5, and TL6 overlapping the second touch cathode electrode TCE2.

According to embodiments of the disclosure as described herein, there may be provided a transparent touch display device including a display panel having a built-in touch sensor capable of precise touch sensing and having superior self-emissive performance and high transmittance.

According to embodiments of the disclosure, there may be provided a transparent touch display device having a touch sensor on a cathode electrode layer by cathode division.

According to embodiments of the disclosure, there may be provided a transparent touch display device having a touch sensor built in a display panel not to influence the transmittance of the display panel.

According to embodiments of the disclosure, there may be provided a transparent touch display device capable of slimming down the display panel and reducing the complexity of the panel manufacturing process.

According to embodiments of the disclosure, there may be provided a transparent touch display device capable of reducing the influence of the driving of the light emitting elements on touch sensing as much as possible by placing the touch line in the metal layer farthest from the anode electrode of the light emitting element when placing the light emitting element and touch sensor in the display panel.

According to embodiments of the disclosure, there may be provided a transparent touch display device capable of mitigating or preventing parasitic capacitance in the touch lines arranged in the display panel.

The description herein has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The description herein and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

The various embodiments described above can be combined to provide further embodiments. Aspects of the embodiments can be modified, if necessary to employ concepts of the various embodiments to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent touch display device, comprising:
   a substrate including a pixel area, a first transmissive area positioned on a first side of the pixel area, and a second transmissive area positioned on a second side of the pixel area;
   a driving transistor disposed in the pixel area;
   an anode electrode disposed in the pixel area, positioned on the driving transistor, and electrically connected with a source electrode or drain electrode of the driving transistor;
   a light emitting layer positioned on the anode electrode;
   a display cathode electrode positioned on the light emitting layer;
   a first touch cathode electrode disposed in the first transmissive area and positioned on a first side of the display cathode electrode;
   a second touch cathode electrode disposed in the second transmissive area and positioned on a second side of the display cathode electrode;
   an encapsulation layer disposed on the display cathode electrode, the first touch cathode electrode, and the second touch cathode electrode; and
   a first touch line overlapping the first touch cathode electrode.

2. The transparent touch display device of claim 1, wherein the first touch line is disposed in a metal layer closer to the substrate than any other metal layer.

3. The transparent touch display device of claim 1, wherein the display cathode electrode includes a same material as the first touch cathode electrode and the second touch cathode electrode, and
   wherein the display cathode electrode is electrically separated from the first touch cathode electrode and the second touch cathode electrode.

4. The transparent touch display device of claim 1, further comprising:
   a first touch bridge electrically connecting the first touch cathode electrode and the second touch cathode electrode across the pixel area, wherein the first touch bridge crosses the first touch line and is electrically connected with the first touch line.

5. The transparent touch display device of claim 4, wherein the first touch bridge includes a first partial bridge including a first metal and a second partial bridge including a second metal different from the first metal, and
wherein the first partial bridge and the second partial bridge are positioned in different layers and are electrically connected with each other.

6. The transparent touch display device of claim 5, wherein the first touch line includes the first metal, and
wherein the first touch line crosses the second partial bridge of the first touch bridge.

7. The transparent touch display device of claim 5, further comprising:
a first data line, a second data line, a third data line, and a fourth data line disposed in the pixel area,
wherein each of the first data line, the second data line, the third data line, and the fourth data line includes a third metal different from the first metal and the second metal, and
wherein each of the first data line, the second data line, the third data line, and the fourth data line crosses the first partial bridge or the second partial bridge of the first touch bridge.

8. The transparent touch display device of claim 5, further comprising:
a reference voltage line disposed in the pixel area, wherein the reference voltage line includes the first metal and crosses the second partial bridge of the first touch bridge.

9. The transparent touch display device of claim 5, further comprising:
a base voltage line disposed in the pixel area and overlapping the display cathode electrode,
wherein the base voltage line includes a first partial base voltage line including the second metal and a second partial base voltage line including a third metal different from the first metal and the second metal,
wherein the second partial base voltage line includes a double layer part overlapping the first partial base voltage line and a single layer part not overlapping the first partial base voltage line, and
wherein the first partial base voltage line overlaps the first partial bridge of the first touch bridge, and the double layer part of the second partial base voltage line overlaps the first partial bridge of the first touch bridge.

10. The transparent touch display device of claim 9, further comprising:
a first scan signal line that crosses the first transmissive area, the pixel area, and the second transmissive area, wherein the first partial base voltage line does not cross the first scan signal line, and the second partial base voltage line crosses the first scan signal line.

11. The transparent touch display device of claim 5, further comprising:
a driving voltage line disposed in the pixel area and overlapping the display cathode electrode, wherein the driving voltage line includes a first partial driving voltage line including the second metal and a second partial driving voltage line including a third metal different from the first metal and the second metal,
wherein the second partial driving voltage line includes a double layer part overlapping the first partial driving voltage line and a single layer part offsetting from the first partial driving voltage line, and
wherein the first partial driving voltage line overlaps the first partial bridge of the first touch bridge, and the double layer part of the second partial driving voltage line overlaps the first partial bridge of the first touch bridge.

12. The transparent touch display device of claim 1, further comprising:
a base voltage line disposed in the pixel area, overlapping the display cathode electrode, and electrically connected with the display cathode electrode,
wherein the display cathode electrode includes an electrode protrusion, the first touch cathode electrode includes an electrode groove where the electrode protrusion of the display cathode electrode is interposed, and the base voltage line includes a line protrusion overlapping the electrode protrusion of the display cathode electrode, and
wherein the line protrusion of the base voltage line is electrically connected with the electrode protrusion of the display cathode electrode.

13. The transparent touch display device of claim 12, wherein the first touch line overlaps the first touch cathode electrode and is bent along the electrode groove of the first touch cathode electrode.

14. The transparent touch display device of claim 1, further comprising a second touch line disposed in the first transmissive area, crossing the first touch bridge, and overlapping the second touch cathode electrode.

15. The transparent touch display device of claim 1, further comprising:
a dummy line overlapping the second touch cathode electrode, wherein the dummy line has a different electrical state from the first touch line, has a floating state, or is not sensed by a touch driving circuit sensing the first touch line.

16. The transparent touch display device of claim 1, wherein the display cathode electrode includes a plurality of openings,
wherein the first touch cathode electrode is disposed in an inner space of a first opening among the plurality of openings of the display cathode electrode, and
wherein the second touch cathode electrode is disposed in an inner space of a second opening among the plurality of openings of the display cathode electrode.

17. The transparent touch display device of claim 1, wherein the first touch cathode electrode and the second touch cathode electrode are portions of an integral touch cathode electrode,
wherein the touch cathode electrode includes a plurality of openings, and
wherein the display cathode electrode is disposed in an inner space of one of the plurality of openings of the touch cathode electrode.

18. The transparent touch display device of claim 1, further comprising an underneath layer positioned under the display cathode electrode, wherein the underneath layer has an undercut structure recessed inwardly in a lower portion thereof,
wherein at a first point where the underneath layer has the undercut structure, the display cathode electrode and the first touch cathode electrode are electrically separated from each other, and
wherein at a second point where the underneath layer has the undercut structure, the display cathode electrode and the second touch cathode electrode are electrically separated from each other.

19. The transparent touch display device of claim 1, wherein a first side portion of the display cathode electrode extends to a partial area of the first transmissive area, and a second side portion of the display cathode electrode extends to a partial area of the second transmissive area.

20. A transparent touch display device, comprising:
- a substrate including a pixel area, a first transmissive area positioned on a first side of the pixel area, and a second transmissive area positioned on a second side of the pixel area;
- a display cathode electrode configured to receive a base voltage for display driving;
- a first touch cathode electrode positioned on a first side of the display cathode electrode and including a same material as the display cathode electrode;
- a second touch cathode electrode positioned on a second side of the display cathode electrode and including a same material as the display cathode electrode;
- a first touch bridge electrically connecting the first touch cathode electrode and the second touch cathode electrode across the pixel area; and
- a first touch line crossing the first touch bridge and overlapping the first touch cathode electrode.

\* \* \* \* \*